(12) United States Patent
Kotani et al.

(10) Patent No.: US 8,519,067 B2
(45) Date of Patent: Aug. 27, 2013

(54) EPOXY RESIN COMPOSITION AND SEMICONDUCTOR DEVICE

(71) Applicant: Sumitomo Bakelite Co., Ltd., Tokyo (JP)

(72) Inventors: Takahiro Kotani, Tochigi (JP); Hidetoshi Seki, Tochigi (JP); Masakatsu Maeda, Tochigi (JP); Kazuya Shigeno, Tochigi (JP); Yosinori Nishitani, Tochigi (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/667,367

(22) Filed: Nov. 2, 2012

(65) Prior Publication Data

US 2013/0119564 A1     May 16, 2013

Related U.S. Application Data

(60) Division of application No. 12/270,162, filed on Nov. 13, 2008, now Pat. No. 8,324,326, which is a continuation of application No. 11/289,265, filed on Nov. 29, 2005, now abandoned.

(30) Foreign Application Priority Data

Nov. 30, 2004 (JP) ................. 2004-347743
Dec. 21, 2004 (JP) ................. 2004-368714
Jan. 7, 2005 (JP) ................. 2005-002381
Feb. 16, 2005 (JP) ................. 2005-039050
Mar. 30, 2005 (JP) ................. 2005-099390

(51) Int. Cl.
*C08K 3/36* (2006.01)
*C08L 61/10* (2006.01)
*C08L 63/00* (2006.01)
*C08L 63/02* (2006.01)
*H01L 23/29* (2006.01)

(52) U.S. Cl.
USPC ........... 525/524; 257/793; 523/434; 523/457; 523/458; 523/467; 525/109; 525/481; 525/529; 525/531

(58) Field of Classification Search
None
See application file for complete search history.

(56) References Cited

U.S. PATENT DOCUMENTS 4,465,542 A    8/1984   Furihata
4,578,425 A    3/1986   Santorelli
2005/0090044 A1   4/2005   Kayaba et al.

FOREIGN PATENT DOCUMENTS

| CN | 1185473 A | | 6/1998 |
|---|---|---|---|
| EP | 0 846 728 A2 | | 6/1998 |
| JP | 10-120873 | | 5/1998 |
| JP | 10-158365 | | 6/1998 |
| JP | 11-140274 | | 5/1999 |
| JP | 11-140274 A | * | 5/1999 |
| JP | 2000-034393 | | 2/2000 |
| JP | 2002-356538 | | 2/2002 |
| JP | 2002-356538 A | * | 12/2002 |
| JP | 2003-128874 | | 5/2003 |
| JP | 2003-109983 | | 11/2003 |
| JP | 2004-75748 A | * | 3/2004 |
| JP | 2004-168907 A | | 6/2004 |
| JP | 2004-168922 | | 6/2004 |
| JP | 2004-292514 | | 10/2004 |
| WO | 03/029321 A1 | | 4/2003 |

* cited by examiner

*Primary Examiner* — Robert Sellers
(74) *Attorney, Agent, or Firm* — Smith, Gambrell & Russell, LLP

(57) ABSTRACT

An epoxy resin composition for encapsulating a semiconductor chip according to this invention comprises (A) a crystalline epoxy resin, (B) a phenol resin represented by general formula (1):

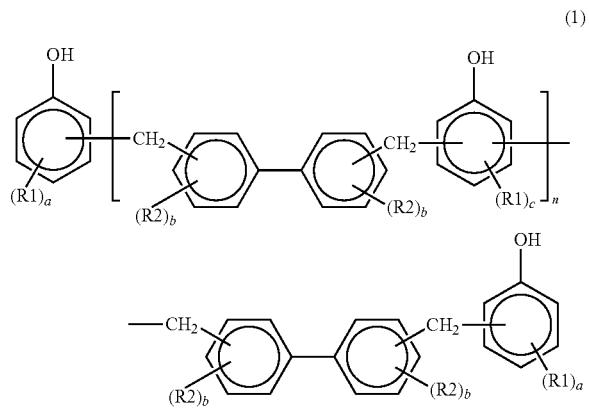

(1)

wherein R1 and R2 are independently hydrogen or alkyl having 1 to 4 carbon atoms and two or more R1s or two or more R2s are the same or different; a is integer of 0 to 4; b is integer of 0 to 4; c is integer of 0 to 3; and n is average and is number of 0 to 10, (C) a (co)polymer containing butadiene-derived structural unit or its derivative, and (D) an inorganic filler in the amount of 80 wt % to 95 wt % both inclusive in the total epoxy resin composition.

6 Claims, No Drawings

EPOXY RESIN COMPOSITION AND SEMICONDUCTOR DEVICE

CROSS REFERENCE TO RELATED APPLICATION

This application is a division of Ser. No. 12/270,162 filed Nov. 13, 2008 (now U.S. Pat. No. 8,324,326), which is a continuation of Ser. No. 11/289,265 (now abandoned) filed Nov. 29, 2005, which claims priority from JP2004-347743, filed Nov. 30, 2004, JP2004-368714, filed Dec. 21, 2004, JP2005-002381, filed Jan. 7, 2005, JP2005-039050, filed Feb. 16, 2005 and JP2005-099390, filed Mar. 30, 2005, which all are being incorporated in their entirety herein by reference.

BACKGROUND

1. Technical Field

This invention relates to an epoxy resin composition for encapsulating a semiconductor chip and a semiconductor device. In particular, this invention is suitably used in an area mounting type semiconductor device where a semiconductor chip is mounted on one side of a printed-wiring board or metal lead frame and substantially only the mounted side is encapsulated with a resin.

2. Related Art

Recent market trend to size reduction, weight saving and higher performance in electronic devices has led to more integrated semiconductors. As surface mounting of a semiconductor device has been accelerated, there has been newly developed an area mounting type semiconductor device, with which a semiconductor device with a conventional structure has been replaced.

Such size reduction and thinning in a semiconductor device has demanded much lower viscosity and much more strength in an epoxy resin composition for encapsulating a semiconductor chip. In addition, because of environmental concerns, an epoxy resin composition for encapsulating a semiconductor chip has been increasingly required to be more flame-resistant without a flame retardant such as bromine-containing compounds and antimony oxide. Due to the background, a recent epoxy resin composition tends to contain a resin with lower viscosity and larger amount of an inorganic filler.

As new trend, a lead-free solder with higher melting point than that conventionally used has been increasingly used for mounting a semiconductor device. When applying the solder, the mounting temperature must be higher than that in a conventional process by about 20° C., sometimes leading to significantly lower reliability of a semiconductor device after mounting in comparison with a common device. In the light of such situation, it has been increasingly required to improve reliability of a semiconductor device by improving properties of an epoxy resin composition. For meeting the requirement, there have been investigations of reducing resin viscosity and filling larger amount of an inorganic filler.

Typical examples of an area mounting type semiconductor device include BGA (ball grid array) and CSP (chip scale package) with a further compacted size, and further packages such as QFN and SON with the smaller mounting area than conventional QFP or SOP. These packages such as QFN and SON were developed to solve the demands of high pin count and high-speed. These demands approach the limit in an area mounting type semiconductor device represented by conventional QFP, SOP and so on.

BGA and CSP are encapsulated by molding an epoxy resin composition on only the side, where the semiconductor chip is mounting, of a hard circuit board such as a circuit board consists of BT resin/copper foil (a bismaleimide-triazine resin/glass fabric substrate) is represented, of a flexible printed circuit board such as a circuit board consists of a polyimide resin film/copper foil is represented. Furthermore, on opposite side of side of a substrate on which a semiconductor chip is mounted, the solder ball is formed in parallel in two dimensions to be mounted on circuit board by soldering.

As described above, the structure of BGA or CSP is a one-side encapsulated structure where only a side of a substrate on which a semiconductor chip is mounted is encapsulated with an epoxy resin composition (and a side of a substrate on which a solder ball is formed is not encapsulated). Therefore, such a semiconductor device tends to be warped immediately after molding, due to unconformity in thermal expansion and thermal shrinkage between the organic substrate or the metal substrate and the cured epoxy-resin composition, or curing shrinkage of the epoxy resin composition during molding curing.

Furthermore, warpage in a semiconductor device causes a joining point of solder balls to be not located horizontally. Therefore, a semiconductor device is lifted from a circuit board during packaging these semiconductor devices by the solder joint on a circuit board, leading to deterioration in reliability of electric connection.

On the contrary, QFN or SON has been produced with the same design as conventional QFP or SOP. There have been recently, however, produced packages by mounting the matrix of semiconductor chips on one side of a metal substrate (for example, a laminate of a copper-lead frame, nickel-palladium+gold-plated lead frame stacked with a polyimide film), encapsulating them with an epoxy resin composition for encapsulating in one batch and cutting the substrate into lattice with a given size to give individual packages (hereinafter, referred to as MAP-QFN and MAP-SON) (for example, see Japanese Patent Laid-open No. 2003-109983).

As in the case of BGA or CSP, the structure of MAP-QFN or MAP-SON is a one-side encapsulated structure where only a side of a substrate on which a semiconductor chip is mounted is encapsulated with an epoxy resin composition. Here, an encapsulated area of MAP-QFN or MAP-SON is larger than common package molding and only one side is encapsulated. Therefore, such a semiconductor device tends to be warped immediately after molding, due to unconformity in thermal expansion and thermal shrinkage between the metal substrate and the cured epoxy-resin composition or curing shrinkage of the epoxy resin composition during molding curing.

Warpage in a semiconductor device causes a semiconductor device to be lifted from a circuit board for mounting that, leading to deterioration in reliability of electric connection.

For reducing warpage in an area mounting type semiconductor device in which substantially one side of an organic substrate or a metal substrate is encapsulated with an epoxy resin composition, it is important to approximate a thermal expansion coefficient of a substrate with that of a cured epoxy resin composition and to reduce curing shrinkage in an epoxy resin composition during molding curing.

To achieve them, there has been already suggested the technique that a multifunctional epoxy resin and a multifunctional phenol resin are combined to increase Tg of an epoxy resin composition and the content of an inorganic filler is adjusted to match $\alpha 1$. Combination of a multifunctional epoxy resin with a multifunctional phenol resin may, however, reduce fluidity to cause problems such as unfilled voids.

When soldering is conducted by solder processing such as infrared reflow, vapor phase soldering and solder immersion, moisture present within a semiconductor device due to moisture absorption by a cured epoxy resin composition (molding) is rapidly vaporized at elevated temperature. A stress generated during the process may cause cracks in the semiconductor device or peeling in an interface between the surface mounting the semiconductor chip in the metal substrate and the cured epoxy resin composition. Therefore, it is needed to reduce a warpage in a semiconductor device by increasing the content of an inorganic filler. It is needed to reduce a stress by reducing hygroscopicity of a molding. Furthermore, improvement in heat resistance of a molding and improved adhesiveness between a cured material and a metal substrate are also needed.

There has been developed the technique for maintaining high fluidity of an epoxy resin composition used in a surface-mounted semiconductor device such as conventional QFP and SOP during molding. For example, there have been disclosed using a resin with low melt viscosity (for example, see Japanese Patent Laid-open No. 1995-130919) and surface treatment of an inorganic filler with a silane coupling agent for increasing the content of an inorganic filler (for example, see Japanese Patent Laid-open No. 1996-20673). Any of these techniques can meet only one of various required properties.

As described above, it is necessary to add an inorganic filler at high concentration for cured material property improvement such as reduced warpage and reduced stress in a molding formed from an epoxy resin composition for encapsulating a semiconductor chip. Furthermore, for improving filling properties of an epoxy resin composition for encapsulating a semiconductor chip, its fluidity must be improved. However, when filling an inorganic filler at high concentration, fluidity of an epoxy resin composition for encapsulating a semiconductor chip is reduced. Thus, there is trade-off relationship between fluidity of an epoxy resin composition for encapsulating a semiconductor chip and cured material properties of a molding.

There have been still needs for an epoxy resin composition for encapsulating a semiconductor chip excellent in both fluidity and cured material properties in a molding, as well as a semiconductor device produced using the composition.

SUMMARY OF THE INVENTION

An objective of this invention for solving the problems in the prior art is to provide an epoxy resin composition for encapsulating a semiconductor chip excellent in both fluidity and cured material properties in a molding, as well as a semiconductor device produced using the composition.

According to present invention, there are provided the followings.

[1]
An epoxy resin composition for encapsulating a semiconductor chip comprising
(A) a crystalline epoxy resin,
(B) a phenol resin represented by general formula (1):

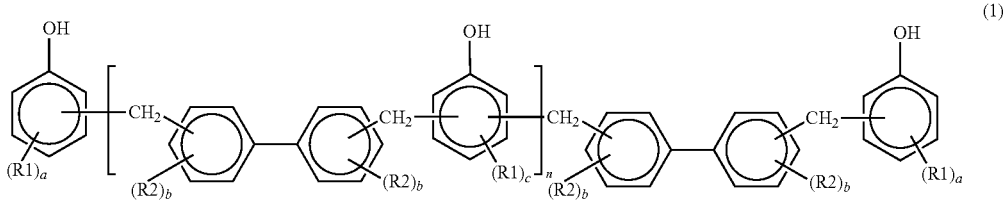

wherein R1 and R2 are independently hydrogen or alkyl having 1 to 4 carbon atoms and two or more R1s or two or more R2s are the same or different; a is integer of 0 to 4; b is integer of 0 to 4; c is integer of 0 to 3; and n is average and is number of 0 to 10,
(C) a (co)polymer containing butadiene-derived structural unit or its derivative, and
(D) an inorganic filler in the amount of 80 wt % to 95 wt % both inclusive in the total epoxy resin composition.

[2]
The epoxy resin composition for encapsulating a semiconductor chip as described in [1],
wherein said phenol resin (B) is represented by general formula (2):

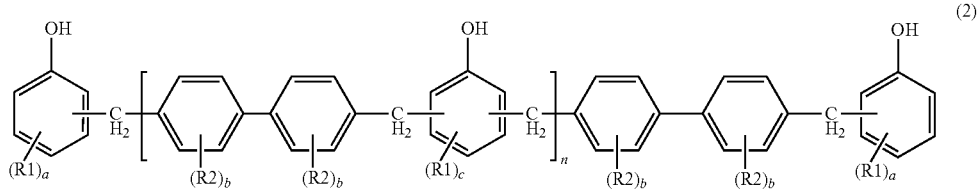

wherein R1 and R2 are independently hydrogen or alkyl having 1 to 4 carbon atoms and two or more R1s or two or more R2s are the same or different; a is integer of 0 to 4; b is integer of 0 to 4; c is integer of 0 to 3; and n is average and is number of 0 to 10;
said (co)polymer or its derivative (C) is an epoxidized polybutadiene compound (C-1); and
said inorganic filler (D) is contained in the amount of 85 wt % to 95 wt % both inclusive in the total epoxy resin composition.

[3]
The epoxy resin composition for encapsulating a semiconductor chip as described in [2],
wherein the number average molecular weight of said epoxidized polybutadiene compound (C-1) is 500 to 4000 both inclusive.

[4]
The epoxy resin composition for encapsulating a semiconductor chip as described in [2], further comprising a curing accelerator (E).

[5]
A semiconductor device wherein a semiconductor chip is encapsulated with the epoxy resin composition for encapsulating a semiconductor chip as described in any of [2] to [4].

[6]
An area mounting type epoxy resin composition for encapsulating a semiconductor chip which is the epoxy resin composition for encapsulating a semiconductor chip as described in any of [2] to [4] used for encapsulating an area mounting type semiconductor device, wherein a semiconductor chip is mounted on one side of the substrate and substantially only the side of the substrate mounting the semiconductor chip is encapsulated.

[7]
An area mounting type semiconductor device, wherein a semiconductor chip is encapsulated with the area mounting type epoxy resin composition for encapsulating a semiconductor chip as described in [6].

[8]
The epoxy resin composition for encapsulating a semiconductor chip as described in [1],
wherein said phenol resin (B) is represented by general formula (2):

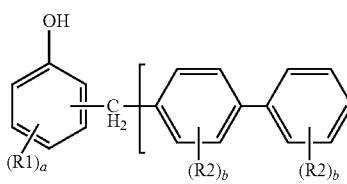

wherein R1 and R2 are independently hydrogen or alkyl having 1 to 4 carbon atoms and two or more R1s or two or more R2s are the same or different; a is integer of 0 to 4; b is integer of 0 to 4; c is integer of 0 to 3; and n is average and is number of 0 to 10,
wherein said (co)polymer or its derivative (C) is a butadiene-acrylonitrile copolymer (C-2).

[9]
The epoxy resin composition for encapsulating a semiconductor chip as described in [8]
wherein said butadiene-acrylonitrile copolymer (C-2) is a carboxyl-terminated butadiene-acrylonitrile copolymer represented by general formula (3):

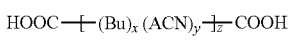

wherein Bu represents a butadiene-derived structural unit; ACN represents an acrylonitrile-derived structural unit; x is positive number of less than 1; y is positive number of less than 1; x+y=1; and z is integer of 50 to 80.

[10]
The epoxy resin composition for encapsulating a semiconductor chip as described in [8],
wherein said butadiene-acrylonitrile copolymer (C-2) is contained in the amount of 0.05 wt % to 0.5 wt % both inclusive in the total epoxy resin composition.

[11]
The epoxy resin composition for encapsulating a semiconductor chip as described in [8]
wherein said inorganic filler (D) is contained in the amount of 85 wt % to 95 wt % both inclusive in the total epoxy resin composition.

[12]
The epoxy resin composition for encapsulating a semiconductor chip as described in [8], further comprising a curing accelerator (E).

[13]
A semiconductor device wherein a semiconductor chip is encapsulated with the epoxy resin composition for encapsulating a semiconductor chip as described in any of [8] to [12].

[14]
An area mounting type epoxy resin composition for encapsulating a semiconductor chip which is the epoxy resin composition for encapsulating a semiconductor chip as described in any of [8] to [12] used for encapsulating an area mounting type semiconductor device,
wherein a semiconductor chip is mounted on one side of the substrate and substantially only the side of the substrate mounting the semiconductor chip is encapsulated.

[15]
An area mounting type semiconductor device, wherein a semiconductor chip is encapsulated with the area mounting type epoxy resin composition for encapsulating a semiconductor chip as described in [14].

[16]
The epoxy resin composition for encapsulating a semiconductor chip as described in [1],
wherein said crystalline epoxy resin (A) is represented by general formula (4):

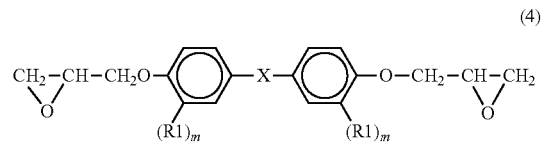

wherein X is group selected from single bond, —O—, —S— and —C(R2)$_2$—; R1 is alkyl having 1 to 6 carbon atoms; two or more R1s are the same or different; m is integer of 0 to 4; R2 is hydrogen or alkyl having 1 to 4 carbon atoms; and two or more R2s is the same or different,
said phenol resin (B) is represented by general formula (5):

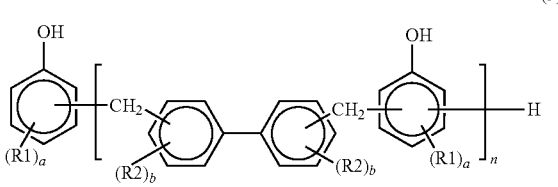

wherein R1 and R2 are independently hydrogen or alkyl having 1 to 4 carbon atoms; two or more R1s or two or more R2s are the same or different; a is integer of 0 to 3; b is integer of 0 to 4; n is average and is positive number of 1 to 5,
said (co)polymer or its derivative (C) is a polybutadiene having the intramolecular oxirane structure (C-3) with the oxirane-oxygen content of 3% to 10% both inclusive, and
said inorganic filler (D) is contained in the amount of 85 wt % to 95 wt %'both inclusive in the total epoxy resin composition; and further comprising (F) an epoxy resin represented by general formula (6):

$$(6)$$

[Chemical structure of formula (6): epoxy resin with OCH₂CHCH₂-O groups, (R1)ₐ, (R2)ᵦ substituents, CH₂ linkages, biphenyl group, and H terminus, with subscript n]

wherein R1 and R2 are independently hydrogen or alkyl having 1 to 4 carbon atoms; two or more R1s or two or more R2s are the same or different; a is integer of 0 to 3, b is integer of 0 to 4; and n is average and is positive number of 1 to 5.

[17]

The epoxy resin composition for encapsulating a semiconductor chip as described in [16], wherein said polybutadiene having the intramolecular oxirane structure (C-3) has a viscosity of 20 Pa·s to 700 Pa·s both inclusive at 25° C.

[18]

The epoxy resin composition for encapsulating a semiconductor chip as described in [16], further comprising a curing accelerator (E).

[19]

A semiconductor device wherein a semiconductor chip is encapsulated with the epoxy resin composition for encapsulating a semiconductor chip as described in any of [16] to [18].

[20]

An area mounting type epoxy resin composition for encapsulating a semiconductor chip which is the epoxy resin composition for encapsulating a semiconductor chip as described in any of [16] to [18] used for encapsulating an area mounting type semiconductor device, wherein a semiconductor chip is mounted on one side of the substrate and substantially only the side of the substrate mounting the semiconductor chip is encapsulated.

[21]

An area mounting type semiconductor device, wherein a semiconductor chip is encapsulated with the area mounting type epoxy resin composition for encapsulating a semiconductor chip as described in [20].

[22]

The epoxy resin composition for encapsulating a semiconductor chip as described in [1], wherein said crystalline epoxy resin (A) is represented by general formula (4):

$$(4)$$

[Chemical structure of formula (4): CH₂—CH—CH₂O—[phenyl with (R1)ₘ]—X—[phenyl with (R1)ₘ]—O—CH₂—CH—CH₂ with epoxide groups on both ends]

wherein X is group selected from single bond, —O—, —S— and —C(R2)₂—; R1 is alkyl having 1 to 6 carbon atoms; two or more R1s are the same or different; m is integer of 0 to 4; R2 is hydrogen or alkyl having 1 to 4 carbon atoms; and two or more R2s is the same or different, said phenol resin (B) is represented by general formula (5):

$$(5)$$

[Chemical structure of formula (5): phenol resin with OH-phenyl-(R1)ₐ—CH₂—phenyl(R2)ᵦ—biphenyl—phenyl(R2)ᵦ—CH₂—phenyl(R1)ₐ—H, subscript n]

wherein R1 and R2 are independently hydrogen or alkyl having 1 to 4 carbon atoms; two or more R1s or two or more R2s are the same or different; a is integer of 0 to 3; b is integer of 0 to 4; n is average and is positive number of 1 to 5, and said (co)polymer or its derivative (C) is an epoxidized polybutadiene compound (C-1), said inorganic filler (D) is contained in the amount of 80 wt % to 94 wt % both inclusive in the total epoxy resin composition;

further comprising (F) an epoxy resin represented by general formula (6):

$$(6)$$

[Chemical structure of formula (6): epoxy resin with OCH₂CHCH₂-O groups, (R1)ₐ, (R2)ᵦ substituents, CH₂ linkages, biphenyl, H terminus, subscript n]

wherein R1 and R2 are independently hydrogen or alkyl having 1 to 4 carbon atoms; two or more R1s or two or more R2s are the same or different; a is integer of 0 to 3; b is integer of 0 to 4; and n is average and is positive number of 1 to 5; and wherein the weight ratio [(F)/(A)] of said epoxy resin (F) to said crystalline epoxy resin (A) represented by general formula (4) is 10/90 to 90/10 both inclusive.

[23]

The epoxy resin composition for encapsulating a semiconductor chip as described in [22], wherein said epoxidized polybutadiene compound (C-1) has the number average molecular weight of 500 to 4000 both inclusive.

[24]

The epoxy resin composition for encapsulating a semiconductor chip as described in [22], further comprising a curing accelerator (E).

[25]

A semiconductor device wherein a semiconductor chip is encapsulated with the epoxy resin composition for encapsulating a semiconductor chip as described in any of [22] to [24].

[26]

An area mounting type epoxy resin composition for encapsulating a semiconductor chip which is the epoxy resin composition for encapsulating a semiconductor chip as described in any of [22] to [24] used for encapsulating an area mounting type semiconductor device, wherein a semiconductor chip is mounted on one side of the substrate and substantially only the side of the substrate mounting the semiconductor chip is encapsulated.

[27]

An area mounting type semiconductor device, wherein a semiconductor chip is encapsulated with the area mounting type epoxy resin composition for encapsulating a semiconductor chip as described in [26].

[28]

The epoxy resin composition for encapsulating a semiconductor chip as described in [1], wherein said crystalline epoxy resin (A) is represented by general formula (4):

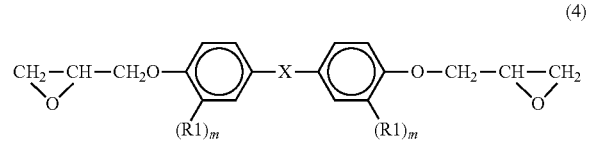

(4)

wherein X is group selected from single bond, —O—, —S— and —C(R2)$_2$—; R1 is alkyl having 1 to 6 carbon atoms; two or more R1s are the same or different; m is integer of 0 to 4; R2 is hydrogen or alkyl having 1 to 4 carbon atoms; and two or more R2s is the same or different, said phenol resin (B) is represented by general formula (5):

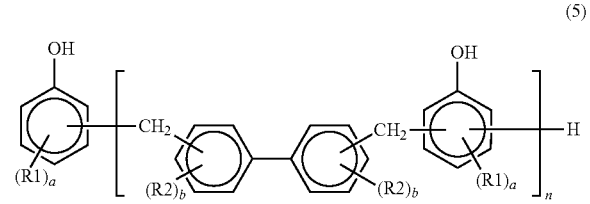

(5)

wherein R1 and R2 are independently hydrogen or alkyl having 1 to 4 carbon atoms; two or more R1s or two or more R2s are the same or different; a is integer of 0 to 3; b is integer of 0 to 4; n is average and is positive number of 1 to 5, and said (co)polymer or its derivative (C) is a butadiene-acrylonitrile copolymer (C-2); and further comprising (F) an epoxy resin represented by general formula (6):

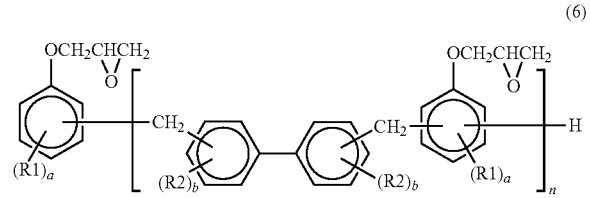

(6)

wherein R1 and R2 are independently hydrogen or alkyl having 1 to 4 carbon atoms; two or more R1s or two or more R2s are the same or different; a is integer of 0 to 3, b is integer of 0 to 4; and n is average and is positive number of 1 to 5.

[29]

The epoxy resin composition for encapsulating a semiconductor chip as described in [28]

wherein said butadiene-acrylonitrile copolymer (C-2) is a carboxyl-terminated butadiene-acrylonitrile copolymer represented by general formula (3):

(3)

wherein Bu represents a butadiene-derived structural unit; ACN represents an acrylonitrile-derived structural unit; x is positive number of less than 1; y is positive number of less than 1; x+y=1; and z is integer of 50 to 80.

[30]

The epoxy resin composition for encapsulating a semiconductor chip as described in [28], wherein said butadiene-acrylonitrile copolymer (C-2) is contained in the amount of 0.05 wt % to 0.5 wt % both inclusive in the total epoxy resin composition.

[31]

The epoxy resin composition for encapsulating a semiconductor chip as described in [28], wherein the weight ratio [(F)/(A)] of the epoxy resin (F) to the crystalline epoxy resin (A) represented by general formula (4) is 10/90 to 90/10 both inclusive.

[32]

The epoxy resin composition for encapsulating a semiconductor chip as described in [28], further comprising a curing accelerator (E).

[33]

A semiconductor device wherein a semiconductor chip is encapsulated with the epoxy resin composition for encapsulating a semiconductor chip as described in any of [28] to [32].

[34]

An area mounting type epoxy resin composition for encapsulating a semiconductor chip which is the epoxy resin composition for encapsulating a semiconductor chip as described in any of [28] to [32] used for encapsulating an area mounting type semiconductor device, wherein a semiconductor chip is mounted on one side of the substrate and substantially only the side of the substrate mounting the semiconductor chip is encapsulated.

[35]

An area mounting type semiconductor device, wherein a semiconductor chip is encapsulated with the area mounting type epoxy resin composition for encapsulating a semiconductor chip as described in [34].

An epoxy resin composition for encapsulating a semiconductor chip according to the present invention can allow for higher filling rate of an inorganic filler and higher fluidity in comparison with the prior art. The epoxy resin composition for encapsulating a semiconductor chip according to the present invention can, therefore, exhibit good cured material properties such as warpage reduction in a molding and a reduced stress and good filling properties. Thus, it is particularly suitable for an area mounting type epoxy resin composition for encapsulating a semiconductor chip and a semiconductor device with the composition.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purpose.

An epoxy resin composition for encapsulating a semiconductor chip according to the present invention contains the following components (A) to (D):

(A) a crystalline epoxy resin,
(B) a phenol resin represented by general formula (1):

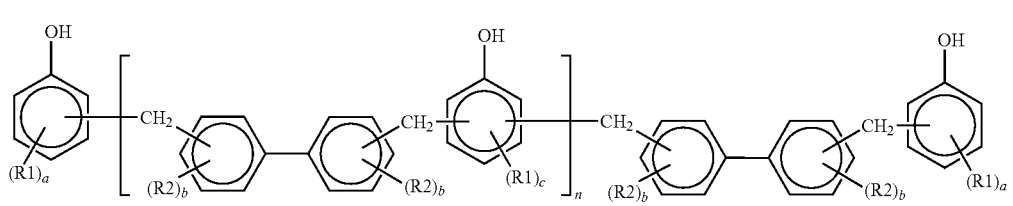

(1)

wherein R1 and R2 are independently hydrogen or alkyl having 1 to 4 carbon atoms and two or more R1s or two or more R2s are the same or different; a is integer of 0 to 4; b is integer of 0 to 4; c is integer of 0 to 3; and n is average and is number of 0 to 10, (C) a (co)polymer containing butadiene-derived structural unit or its derivative, and (D) an inorganic filler.

The inorganic filler (D) is contained in the amount of 80 wt % to 95 wt % both inclusive in the total epoxy resin composition.

An epoxy resin composition for encapsulating a semiconductor chip having such a composition can satisfy both requirements of reduction in thermal expansion by higher content of the inorganic filler (D) and reduction in elasticity by adding the (co)polymer having a butadiene-derived structural unit or its derivative (C). Thus, the epoxy resin composition for encapsulating a semiconductor chip exhibits improved fluidity, reduced warpage in a cured material and soldering resistance, which are required to an area mounting type semiconductor device. There can be, therefore, more reliable semiconductor device.

There will be detailed an epoxy resin composition for encapsulating a semiconductor chip according to the present invention.

Crystalline Epoxy Resin (A)

Examples of a crystalline epoxy resin (A) used in this invention include glycidyl ether of hydroquinone, bisphenol-F type epoxy resins, biphenyl type epoxy resins represented by general formula (7), stilbene type epoxy resins represented by general formula (8) and epoxy resins represented by general formula (4).

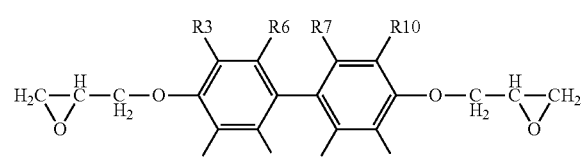

(7)

wherein R3 to R10 are hydrogen or alkyl having up to 4 carbon atoms and are the same or different.

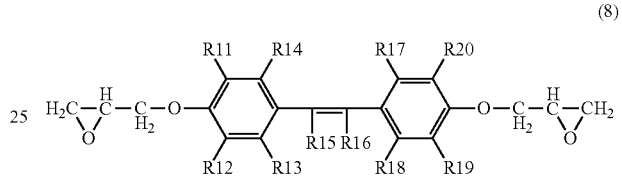

(8)

wherein R11 to R20 are hydrogen or alkyl having up to 4 carbon atoms and are the same or different.

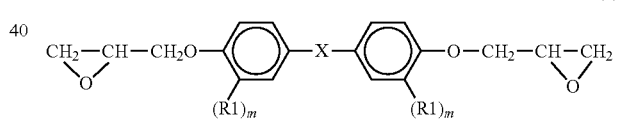

(4)

wherein X is group selected from single bond, —O—, —S— and —C(R2)$_2$—; R1 is alkyl having 1 to 6 carbon atoms and two or more R1s are the same or different; m is integer of 0 to 4; R2 is hydrogen or alkyl having 1 to 4 carbon atoms and two or more R2s are the same or different.

Phenol Resin (B)

A phenol resin (B) used in this invention is represented by general formula (1):

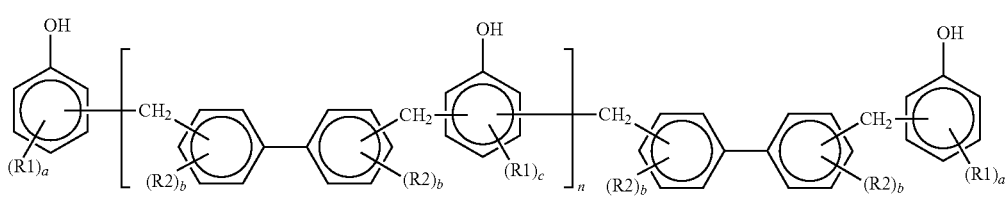

(1)

wherein R1 and R2 are independently hydrogen or alkyl having 1 to 4 carbon atoms, and two or more R1s or two or more R2s are the same or different; a is integer of 0 to 4; b is integer of 0 to 4; c is integer of 0 to 3; n is average and is number of 0 to 10.

(Co)Polymer Having a Butadiene-Derived Structural Unit or its Derivative (C)

A (co)polymer having a butadiene-derived structural unit or its derivative (C) used in this invention (hereinafter, sometimes simply referred to as "(co)polymer or its derivative (C)") is a (co)polymer or its derivative (C), which is prepared from butadiene as a monomer.

The (co)polymer or its derivative (C) may be an epoxidized polybutadiene compound (C-1), a butadiene-acrylonitrile copolymer (C-2) or a polybutadiene having an oxirane structure (C-3). These compounds will be described later.

Inorganic Filler (D)

An inorganic filler (D) used in this invention may be selected from those generally used for an epoxy resin composition for encapsulating a semiconductor chip.

These may include fused silica, crystalline silica, secondary aggregated silica, alumina, titanium white, aluminum hydroxide, talc, clay and glass fiber, which may be used alone or in combination of two or more. Fused silica is particularly preferable. Fused silica may be in the form of milled particles or spheres. More preferably, spherical silica may be used for increasing its content and minimizing increase in melt viscosity of an epoxy resin composition. In order to increase the content of spherical silica, it is desirable to adjust size distribution of the spherical silica to be relatively wider.

Furthermore, an inorganic filler may be, if necessary, surface-treated with a coupling agent, an epoxy resin or a phenol resin. Surface treatment may be conducted by appropriate process such as removing a solvent after blending them in the solvent and directly adding the additives to an inorganic filler to give a mixture which is then treated using a mixer.

An epoxy resin composition for encapsulating a semiconductor chip according to this invention may contain, in addition to components (A) to (D) described above, a curing accelerator (E), an epoxy resin (F) and a silane coupling agent (G).

Curing Accelerator (E)

A curing accelerator (E) may be selected from, without any particular restrictions, those capable of accelerating reaction of an epoxy group with a phenolic hydroxyl group, including diazabicycloalkenes and their derivatives such as 1,8-diazabicyclo(5,4,0)undecene-7;

organophosphines and their derivatives such as triphenylphosphine and methyldiphenylphosphine; and tetra-substitutedphosphonium.tetra-substitutedborates such as tetraphenylphosphonium.tetraphenylborate, tetraphenylphosphonium.tetrabenzoic acid borate, tetraphenylphosphonium.tetranaphthoic acid borate, tetraphenylphosphonium/tetranaphthoyloxyborate, and tetraphenylphosphonium.tetranaphthyloxyborate. These may be used alone or in combination of two or more.

Epoxy Resin (F)

An epoxy resin (F) may be an epoxy resin represented by general formula (6):

$$\text{(6)}$$

wherein R1 and R2 are independently hydrogen or alkyl having 1 to 4 carbon atoms, and two or more R1s or two or more R2s are the same or different; a is integer of 0 to 3; b is integer of 0 to 4; and n is average and is positive number of 1 to 5.

Silane Coupling Agent (G)

A silane coupling agent (G) may be a compound represented by general formula (9):

$$R3\text{-}NH\text{---}R4\text{-}Si(OR5)_n R6_{3-n} \tag{9}$$

wherein R3 is an organic group having 1 to 12 carbon atoms; R4, R5 and R6 are hydrocarbon having 1 to 12 carbon atoms; R3 to R6 are the same or different; and n is integer of 1 to 3.

Other Components

In necessary, an epoxy resin composition of this invention may appropriately contain, in addition to components (A) to (G) described above, any of various additives, including a natural wax such as carnauba wax;

a synthetic wax such as polyethylene wax;

a higher fatty acid or its metal salts such as stearic acid and zinc stearate;

a mold release such as paraffin;

a coloring agent such as carbon black and red ocher;

a flame retardant such as brominated epoxy resins, antimony trioxide, aluminum hydroxide, magnesium hydroxide, zinc borate, zinc molybdenum oxide, phosphazene and phosphorous compounds;

an inorganic ion exchanger such as bismuth oxide hydrate; and a low stress component such as silicone oils and rubbers; and an antioxidant.

An epoxy resin composition of this invention may be prepared by mixing components (A) to (G) and other additives at ambient temperature using, for example, a mixer, kneading the mixture with heating by kneading means such as a roller mill, a kneader and an extruder, and cooling and then milling the mixture.

For manufacturing a semiconductor device by encapsulating an electronic part such as a semiconductor chip using an epoxy resin composition of this invention, curing molding may be conducted by a conventional molding process such as transfer molding, compression molding and injection molding. Other methods involved in manufacturing a semiconductor device may be selected from well-known methods. In particular, an epoxy resin composition of this invention is most suitable for an area mounting type semiconductor device.

Preferred embodiments of this invention will be described.

Embodiment 1

An epoxy resin composition for encapsulating a semiconductor chip of Embodiment 1 contains the following components (A) to (E):

(A) a crystalline epoxy resin,
(B) a phenol resin represented by general formula (2),
(C-1) an epoxidized polybutadiene compound,
(D) an inorganic filler in the amount of 85 wt % to 95 wt % both inclusive in the total epoxy resin composition, and
(E) a curing accelerator.

The epoxidized polybutadiene compound (C-1) is contained in the amount of 0.05 wt % to 5 wt % both inclusive in the total epoxy resin composition.

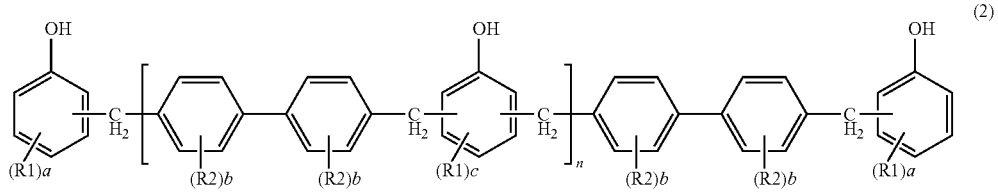

(2)

wherein R1 and R2 are independently hydrogen or alkyl having 1 to 4 carbon atoms and two or more R1s or two or more R2s are the same or different; a is integer of 0 to 4; b is integer of 0 to 4; c is integer of 0 to 3; and n is average and is number of 0 to 10.

Such an epoxy resin composition for encapsulating a semiconductor chip can meet both reduction in thermal expansion by higher content of the inorganic filler (D) and reduction in elasticity by adding the epoxidized polybutadiene compound (C-1). The epoxy resin composition for encapsulating a semiconductor chip is highly fluent and thus has improved filling properties. Furthermore, the epoxy resin composition for encapsulating a semiconductor chip can provide a molding exhibiting excellent cured material properties such as reduced warpage and soldering resistance. The composition can be, therefore, significantly effective to give a highly reliable semiconductor device. As described above, the epoxy resin composition for encapsulating a semiconductor chip of this embodiment can be suitably used for an area mounting type semiconductor device.

There will be specifically described Embodiment 1.

Crystalline Epoxy Resin (A)

Examples of a crystalline epoxy resin (A) used in Embodiment 1 include glycidyl ether of hydroquinone, bisphenol-F type epoxy resins, biphenyl type epoxy resins represented by general formula (7) and stilbene type epoxy resins represented by general formula (8).

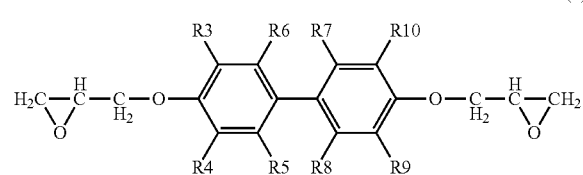

(7)

wherein R3 to R10 are hydrogen or alkyl having up to 4 carbon atoms and are the same or different.

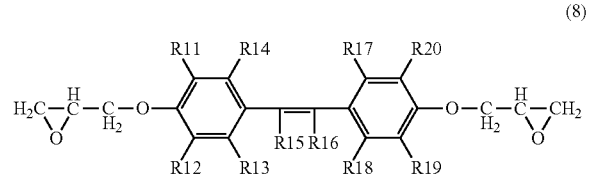

(8)

wherein R11 to R20 are hydrogen or alkyl having up to 4 carbon atoms and are the same or different.

These epoxy resins is solid at ambient temperature so that it exhibits good handling properties, and has low melt viscosity during molding. A lower melt viscosity can improve fluidity of the epoxy resin composition for encapsulating a semiconductor chip and allows for filling the inorganic filler at higher concentration. Thus, moisture resistance can be improved and difference in coefficient of linear expansion can be reduced, resulting in improved properties as a molding.

Preferable examples of the biphenyl type epoxy resin represented by general formula (7) include 4,4'-diglycidylbiphenyl, 3,3',5,5'-tetramethyl-4,4'-diglycidylbiphenyl and a fused mixture of these compounds, which are well-balanced in workability and practicability.

Preferable examples of the stilbene type epoxy resin represented by general formula (8) include 5-tert-butyl-4,4'-glycidyl-2,3',5'-trimethylstilbene, 4,4'-diglycidyl-3,3',5,5'-tetramethylstilbene and a fused mixture of these compounds, which are well-balanced in workability and practicability.

Such a crystalline epoxy resin (A) may be used in combination with another epoxy resin.

When using them in combination, the content of the crystalline epoxy resin (A) is preferably at least 10 wt o, more preferably 30 wt % or more, further preferably 50 wt % or more in the total epoxy resin. The crystalline epoxy resin (A) can be added within the above range, to improve fluidity of an epoxy resin composition for encapsulating a semiconductor chip.

Examples of an epoxy resin which can be combined include, but not limited to, phenol novolac type epoxy resins, cresol novolac type epoxy resins, triphenolmethane type epoxy resins, phenolaralkyl type epoxy resins, naphthol type epoxy resins, naphthalene type epoxy resins, alkyl-modified triphenolmethane type epoxy resins, epoxy resins containing triazine-core and dicyclopentadiene-modified phenol type epoxy resins, which can be used alone or in combination of two or more. It is desirable that an epoxy resin combined has viscosity as low as possible for avoiding deterioration in the advantageous property of the crystalline epoxy resin, that is, lower melt viscosity during molding.

Phenol Resin (B)

A phenol resin (B) used in this embodiment may be a phenol resin represented by general formula (2).

The phenol resin represented by general formula (2) has a hydrophobic and rigid biphenylene moiety between phenolic hydroxyl groups. Thus, the phenol resin (B) having a biphenylene moiety can be used to reduce warpage in a cured product (molding) of an epoxy resin composition for encapsulating a semiconductor chip. Furthermore, the molding has reduced moisture-absorption rate, has lower elasticity modulus in high temperature range over Tg and exhibits good adhesiveness to a semiconductor chip, an organic substrate and a metal substrate. It also has features that it is highly flame-resistance and exhibits higher heat resistance in spite of its low crosslinking density.

In the light of curing properties, the phenol resin represented by general formula (2) is preferably a phenol resin represented by general formula (10).

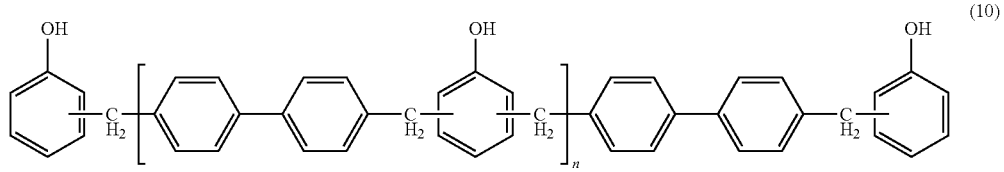

wherein n is average and is number of 0 to 10.

In general formulas (2) and (10), when n is within the above range, fluidity of a resin composition during molding can be improved, resulting in increase in content of an inorganic filler, which can contribute to lowering hygroscopicity and reduction in warpage.

The phenol resin represented by general formula (2) used in Embodiment 1 can be used in combination with another phenol resin. When using them in combination, the content of the phenol resin (B) represented by general formula (2) is preferably at least 10 wt %, more preferably 30 wt % or more, further preferably 50 wt % or more in the total phenol resin. The phenol resin (B) can be added within the above range to provide an epoxy resin composition exhibiting low elasticity at high temperature and low hygroscopicity, and further good adhesiveness and flame resistance.

Examples of a phenol resin which can be used in combination include, but not limited to, phenol novolac resins, cresol novolac resins, naphthol aralkyl resins, triphenolmethane resins, terpene-modified phenol resins, dicyclopentadiene-modified phenol resins and phenol aralkyl resins having a phenylene moiety. These can be used alone or in combination of two or more. For higher content of the inorganic filler, it is preferably of low viscosity as with an epoxy resin.

An equivalence ratio of the number of epoxy groups in the total epoxy resin to the number of phenolic hydroxyl groups in the total phenol resin used in Embodiment 1 is preferably 0.5 to 2 both inclusive, particularly preferably 0.7 to 1.5 both inclusive. When the equivalence ratio is within the above range, an epoxy resin composition for encapsulating a semiconductor chip which provides a molding exhibiting good moisture resistance and curing properties, can be obtained.

Epoxidized Polybutadiene Compound (C-1)

An epoxidized polybutadiene compound (C-1) used in Embodiment 1 may be, but not limited to, a compound represented by general formula (11).

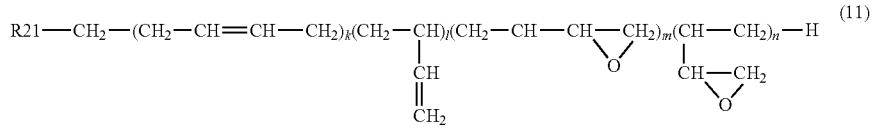

wherein k, l, m and n are integer of 1 to 50; R21 has structure represented by $C_pH_q$; p is integer of 0 to 10; and q is integer of 1 to 21.

A content of the epoxidized polybutadiene compound (C-1) is preferably 0.05 wt % to 5 wt % both inclusive, particularly preferably 0.1 wt % to 2 wt % both inclusive in the total epoxy resin composition. The content within the above range may result in reduction in elasticity modulus and further lowering of viscosity of the epoxy resin composition.

In addition, the number average molecular weight of the epoxidized polybutadiene compound (C-1) used in this embodiment is preferably 500 to 4000 both inclusive. The number average molecular weight within the above range may result in reduction in elasticity modulus of the epoxy resin composition and desired viscosity.

Inorganic Filler (D)

An inorganic filler (D) used in Embodiment 1 may be the inorganic filler described above. A content of the inorganic filler used in this embodiment is 85 wt % to 95 wt % both inclusive, preferably 87 wt % to 93 wt % both inclusive in the total epoxy resin composition. When the content of the inorganic filler (D) is within the above range, a molding prepared may have adequately reduced hygroscopicity and thermal expansion, resulting in good soldering resistance and reduction in warpage in a semiconductor device. Furthermore, fluidity of an epoxy resin composition for encapsulating a semiconductor chip can be improved, so that it can be reliably filled during molding and thus problems such as gold-wire deformation can be prevented.

Curing Accelerator (E)

A curing accelerator (E) used in Embodiment 1 may be the above compound.

Other Components

An epoxy resin composition of this embodiment may contain the other components described above in addition to components (A), (B), (C-1), (D) and (E). Furthermore, the composition may appropriately contain, if necessary, any of various additives including a silane coupling agent such as epoxysilanes, mercaptosilanes, aminosilanes, alkylsilanes, ureidosilanes and vinylsilanes and coupling agents such as titanate coupling agents, aluminum coupling agents and aluminum/zirconium coupling agents.

An epoxy resin composition of Embodiment 1 may be prepared by mixing components (A) to (E) and other additives at ambient temperature using, for example, a mixer, kneading the mixture with heating by kneading means such as a roller mill, a kneader and an extruder, and cooling and then milling the mixture.

For manufacturing a semiconductor device by encapsulating an electronic part such as a semiconductor chip using an epoxy resin composition of Embodiment 1, curing molding may be conducted by a conventional molding process such as transfer molding, compression molding and injection molding. Other methods involved in manufacturing a semiconductor device may be selected from well-known methods. In particular, an epoxy resin composition of this embodiment is most suitable for an area mounting type semiconductor device.

Embodiment 2

An epoxy resin composition for encapsulating a semiconductor chip of Embodiment 2 contains the following components (A) to (C-2):
(A) a crystalline epoxy resin,
(B) a phenol resin represented by general formula (2),
(C-2) a butadiene-acrylonitrile copolymer.

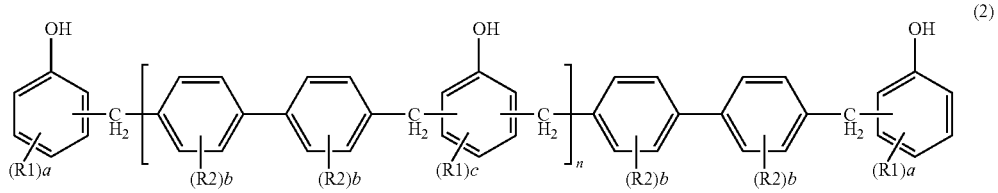

(2)

wherein R1 and R2 are independently hydrogen or alkyl having 1 to 4 carbon atoms and two or more R1s or two or more R2s are the same or different; a is integer of 0 to 4; b is integer of 0 to 4; c is integer of 0 to 3; and n is average and is number of 0 to 10.

Such an epoxy resin composition may meet both higher content of an inorganic filler and higher fluidity. Furthermore, the epoxy resin composition for encapsulating a semiconductor chip can provide a molding exhibiting excellent cured material properties such as reduced warpage and soldering resistance. The composition can be, therefore, significantly effective to give a highly reliable semiconductor device. As described above, the epoxy resin composition for encapsulating a semiconductor chip of this embodiment can be suitably used for an area mounting type semiconductor device.

There will be specifically described Embodiment 2.

Crystalline Epoxy Resin (A)

A crystalline epoxy resin (A) used in Embodiment 2 can be as described in Embodiment 1

The crystalline epoxy resin (A) of this embodiment may be combined with another epoxy resin as described in Embodiment 1. When using them in combination, the content of the crystalline epoxy resin (A) is preferably at least 10 wt %, more preferably 30 wt % or more, further preferably 50 wt % or more in the total epoxy resin. The crystalline epoxy resin (A) can be added within the above range, to improve fluidity of epoxy resin composition.

Phenol Resin (B)

A phenol resin (B) used in Embodiment 2 may be a compound represented by general formula (2) as described in Embodiment 1.

The phenol resin (B) in Embodiment 2 may be combined with another phenol resin as described in Embodiment 1. When using them in combination, the content of the phenol resin (B) is preferably at least 10 wt o, more preferably 30 wt % or more, further preferably 50 wt % or more in the total phenol resin. The phenol resin (B) within the above range can be added to an epoxy resin composition for encapsulating a semiconductor chip to provide a molding exhibiting low elasticity at high temperature and low hygroscopicity, and further good adhesiveness and flame resistance.

An equivalence ratio of the number of epoxy groups in the total epoxy resin to the number of phenolic hydroxyl groups in the total phenol resin used in this embodiment is preferably 0.5 to 2 both inclusive, particularly preferably 0.7 to 1.5 both inclusive. When the equivalence ratio is within the above range, an epoxy resin composition exhibiting good moisture resistance and curing properties can be obtained.

Butadiene-Acrylonitrile Copolymer (C-2)

A butadiene-acrylonitrile copolymer (C-2) used in Embodiment 2 may be, but not limited to, a compound represented by general formula (3), both of whose ends have a carboxyl group.

(3)

wherein Bu represents a butadiene-derived structural unit; ACN represents an acrylonitrile-derived structural unit; x is positive number of less than 1; y is positive number of less than 1; x+y=1; and z is integer of 50 to 80.

The carboxyl groups in the butadiene-acrylonitrile copolymer (C-2) can combine an inorganic filler and an epoxy resin as starting materials for an epoxy resin composition for encapsulating, with a semiconductor chip and an organic substrate as semiconductor device members.

A content of the butadiene-acrylonitrile copolymer (C-2) used in this embodiment is preferably 0.05 to 0.5 wt % both inclusive, more preferably 0.1 wt % to 0.3 wt % both inclusive in the total epoxy resin composition.

The content within the above range can improve soldering resistance because it brings about good adhesiveness between a cured product from an epoxy resin composition for encapsulating a semiconductor chip and a substrate. Furthermore, the epoxy resin composition can become adequately fluent to be reliably filled during molding, resulting in prevention of gold-wire deformation within a semiconductor device.

An epoxy resin composition for encapsulating a semiconductor chip of this embodiment may contain, in addition to components (A) to (C-2) described above, an inorganic filler (D) and/or a curing accelerator (E).

Inorganic Filler (D)

An inorganic filler (D) used in Embodiment 2 may be the filler as described in Embodiment 1. A content of the inorganic filler (D) used in this embodiment is 85 wt % to 95 wt % both inclusive, preferably 87 to 93 wt % both inclusive in the total epoxy resin composition. When the content of the inorganic filler (D) is within the above range, a molding prepared may have adequately reduced hygroscopicity and thermal expansion, resulting in good soldering resistance and reduction in warpage in a semiconductor device. Furthermore, fluidity of an epoxy resin composition for encapsulating a semiconductor chip can be improved, so that it can be reliably filled during molding and thus problems such as gold-wire deformation can be prevented.

Curing Accelerator (E)

A curing accelerator (E) used in Embodiment 2 may be the compound as described in Embodiment 1.

Other Components

An epoxy resin composition in Embodiment 2 may be selected from those as described in Embodiment 1 or others.

The epoxy resin composition in Embodiment 2 can be prepared as described in Embodiment 1. Furthermore, the epoxy resin composition can be used to encapsulate an electronic part such as a semiconductor chip to prepare a semiconductor device as described in Embodiment 1.

Embodiment 3

An epoxy resin composition for encapsulating a semiconductor chip according to Embodiment 3 contains the following components (A) to (G).

(A) a crystalline epoxy resin represented by general formula (4), (B) a phenol resin represented by general formula (5), (C-3) a polybutadiene having the intramolecular oxirane structure, (D) a curing accelerator, (E) an inorganic filler in the amount of 85 wt % to 95 wt % both inclusive in the total epoxy resin composition, (F) an epoxy resin represented by general formula (6), and (G) a silane coupling agent represented by general formula (9).

An oxirane-oxygen content in the polybutadiene (C-3) is 3% to 10% both inclusive.

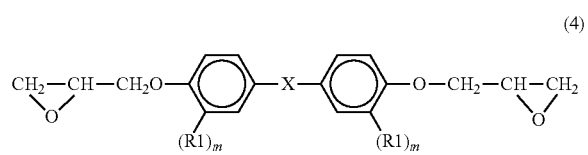

(4)

wherein X is group selected from single bond, —O—, —S— and —C(R2)$_2$—; R1 is alkyl having 1 to 6 carbon atoms and two or more R1s are the same or different; m is integer of 0 to 4; R2 is hydrogen or alkyl having 1 to 4 carbon atoms and two or more R2s are the same or different.

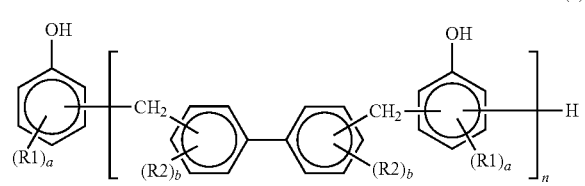

(5)

wherein R1 and R2 are independently hydrogen or alkyl having 1 to 4 carbon atoms, and two or more R1s or two or more R2s are the same or different; a is integer of 0 to 3; b is integer of 0 to 4; and n is average and is positive number of 1 to 5.

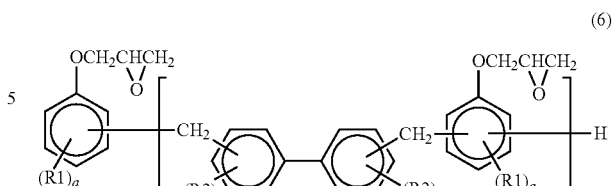

(6)

wherein R1 and R2 are independently hydrogen or alkyl having 1 to 4 carbon atoms, and two or more R1s or two or more R2s are the same or different; a is integer of 0 to 3; b is integer of 0 to 4; and n is average and is positive number of 1 to 5.

$$R3-NH-R4-Si(OR5)_nR6_{3-n} \quad (9)$$

wherein R3 is an organic group having 1 to 12 carbon atoms; R4, R5 and R6 are hydrocarbon having 1 to 12 carbon atoms; R3 to R6 are the same or different; and n is integer of 1 to 3.

Such an epoxy resin composition may meet both higher content of an inorganic filler and higher fluidity. Furthermore, the epoxy resin composition for encapsulating a semiconductor chip can provide a molding exhibiting excellent cured material properties such as reduced warpage and soldering resistance. The composition can be, therefore, significantly effective to give a highly reliable semiconductor device. As described above, the epoxy resin composition for encapsulating a semiconductor chip of this embodiment can be suitably used for an area mounting type semiconductor device.

There will be specifically described Embodiment 3.

Crystalline Epoxy Resin (A)

A crystalline epoxy resin (A) used in Embodiment 3 may be a crystalline epoxy resin represented by general formula (4). The crystalline epoxy resin (A) represented by general formula (4) is a solid at ambient temperature, but becomes extremely low viscous liquid at temperature over its melting point, so that an inorganic filler can be added in higher content. An epoxy resin composition containing the resin can, therefore, exhibit excellent soldering resistance.

The crystalline epoxy resin (A) represented by general formula (4) may be, for example, a bisphenol A type epoxy resin, but there are no particular restrictions as long as it has the structure of general formula (4).

A content of another epoxy resin combined is, if any, preferably such that the epoxy resin (F) and the crystalline epoxy resin (A) amount to 70 wt % to 100 wt % both inclusive to the total epoxy resin. When the total amount of the epoxy resin (F) and the crystalline epoxy resin (A) is within the above range, a cured product can has lower moisture absorption rate and exhibit excellent crack resistance.

An epoxy resin which can be combined may be a monomer, oligomer or polymer having an intramolecular epoxy group. Examples of an epoxy resin which can be combined include phenol novolac type epoxy resins, ortho-cresol novolac type epoxy resins, naphthol novolac type epoxy resins, phenol aralkyl type epoxy resins having a phenylene moiety, naphthol aralkyl type epoxy resins (having, for example, a phenylene or biphenyl moiety), dicyclopentadiene-modified phenol type epoxy resins, stilbene type epoxy resins, triphenolmethane type epoxy resins, alkyl-modified triphenolmethane type epoxy resins and epoxy resins containing triazine-core. The epoxy resin, which can be combined, may be one or combination of two or more selected from these compounds.

Phenol Resin (B)

A phenol resin (B) used in Embodiment 3 may be a phenol resin represented by general formula (5).

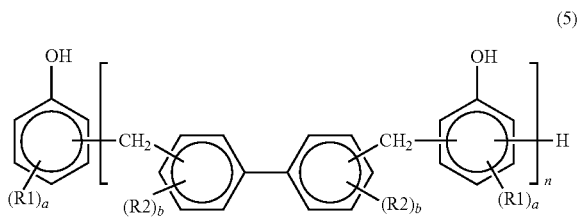

(5)

wherein R1 and R2 are independently hydrogen or alkyl having 1 to 4 carbon atoms, and two or more R1s or two or more R2s are the same or different; a is integer of 0 to 3; b is integer of 0 to 4; and n is average and is positive number of 1 to 5.

The phenol resin represented by general formula (5). has a hydrophobic and rigid biphenylene moiety between phenolic hydroxyl groups. A cured product prepared from an epoxy resin composition containing the phenol resin has reduced moisture-absorption rate and lower elasticity modulus in high temperature range over Tg. It also exhibits good adhesiveness to a semiconductor chip, an organic substrate and a metal substrate. It also has the feature that it exhibits higher heat resistance in spite of its low crosslinking density. Therefore, a semiconductor device encapsulated with a resin composition containing the phenol resin exhibits excellent crack resistance.

In general formula (5), n is average and is positive number of 1 to 5, preferably integer of 1 to 3. With n within the above range, an epoxy resin composition exhibits good curing properties and improved fluidity. The phenol resins represented by general formula (5) may be used alone or in combination of two or more.

The phenol resin represented by general formula (5) may be, for example, a phenol biphenyl aralkyl resin, but there are no particular restrictions as long as it has the structure of general formula (5).

In this embodiment, another phenol resin may be combined as long as it does not deteriorate the features obtained by using the phenol resin (B) represented by general formula (5). A content of the additional phenol resin combined is preferably such that the content of the phenol resin (B) is 70 wt % to 100 wt % both inclusive in the total phenol resin. With the content of the phenol resin (B) within the above range, a cured product has a reduced moisture-absorption rate. Furthermore, the cured product exhibits excellent adhesiveness to a base material and soldering resistance after soldering.

The additional phenol resin may be a monomer, oligomer or polymer having an intramolecular phenolic hydroxyl group, which desirably has viscosity as low as possible. Examples include phenol novolac resins, cresol novolac resins, phenolaralkyl resins (having a phenylene moiety), naphtholaralkyl resins, triphenolmethane resins, terpene-modified phenol resins and dicyclopentadiene-modified phenol resin, which may be used alone or in combination of two or more. In the light of reliability in moisture resistance as an epoxy resin composition for encapsulating a semiconductor chip, it is preferable that the resin contains Na or Cl ions as ionic impurities as little as possible.

An equivalence ratio of the number of epoxy groups in the total epoxy resin to the number of phenolic hydroxyl groups in the phenol resin, i.e., the epoxy number/the phenolic hydroxyl number, is preferably 0.7 to 1.5 both inclusive. With the ratio within the range, an epoxy resin for encapsulating a semiconductor chip exhibits excellent curing properties. Furthermore, a cured product has an increased glass-transition temperature and improved reliability in moisture resistance. When combining the epoxy resin (F) and the crystalline epoxy resin (A) with the phenol resin (B), the highest effects can be achieved in crack resistance and warpage, in soldering after moisture absorption.

Polybutadiene Having the Intramolecular Oxirane Structure (C-3)

A polybutadiene (C-3) used in this embodiment has the intramolecular oxirane structure. A content of the oxirane oxygen influences adhesiveness. As determined in accordance with standard methods for the analysis of fats, oils and related materials (oxirane oxygen), the oxirane-oxygen content is 3% to 10% both inclusive, more preferably 5% to 8% both inclusive. With the oxirane-oxygen content within the above range, adhesiveness of a cured product to a substrate is improved. Furthermore, fluidity of an epoxy resin composition can be improved, resulting in reliable filling.

A viscosity of the polybutadiene (C-3) having the intramolecular oxirane structure influences viscosity of a resin composition for encapsulating a semiconductor chip. A viscosity of an epoxy resin composition for encapsulating a semiconductor chip containing the polybutadiene (C-3) is 20 Pa·s to 700 Pa·s both inclusive, more preferably 50 Pa·s to 500 Pa·s both inclusive as determined at 25° C. in accordance with JIS Z-8803. With the viscosity within the above range, the epoxy resin composition for encapsulating a semiconductor chip exhibits improved fluidity. Furthermore, a cured product exhibits good adhesiveness to a substrate and warpage in a semiconductor device is minimized.

The polybutadiene (C-3) having an oxirane structure may be the compound as represented by general formula (11). In this embodiment, the polybutadiene (C-3) is essential.

The polybutadiene (C-3) can improve adhesiveness of an epoxy resin composition with a metal substrate (for example, nickel-palladium or nickel-palladium-gold plating), resulting in high reflow heat resistance.

As long as effects of using the polybutadiene (C-3) are not deteriorated, another stress-lowering agent may be combined. Examples of a stress-lowering agent which can be combined, include silicone oils such as organopolysiloxanes and rubbers such as silicone rubbers and acrylonitrile rubbers which are solid at ambient temperature.

Its content is 0.05 wt % to 1.5 wt % both inclusive, preferably 0.1 wt % to 1 wt % both inclusive. With the content within the range, a cured product exhibits excellent adhesiveness to a substrate. Furthermore, fluidity of an epoxy resin composition can be improved, resulting in more reliable filling.

Inorganic Filler (D)

An inorganic filler (D) used in Embodiment 3 may be the filler as described in Embodiment 1. A content of the inorganic filler (D) is 85 wt % to 95 wt % both inclusive, preferably 87 to 93 wt % both inclusive in the total epoxy resin composition. When the content of the inorganic filler (D) is within the above range, a molding prepared may have adequately reduced hygroscopicity and thermal expansion, resulting in good soldering resistance and reduction in warpage in a semiconductor device. Furthermore, fluidity of an epoxy resin composition for encapsulating a semiconductor chip can be improved, so that it can be reliably filled during molding and thus problems such as gold-wire deformation can be prevented.

Curing Accelerator (E)

A curing accelerator (E) used in Embodiment 3 may be the compound as described in Embodiment 1.

Epoxy Resin (F)

An epoxy resin (F) may be the epoxy resin represented by general formula (6).

As seen in formula (6), the epoxy resin (F) has hydrophobic and rigid biphenylene moiety between epoxy groups. Thus, a cured product prepared from the epoxy resin composition containing the epoxy resin (F) has reduced moisture-absorption rate and lower elasticity modulus in high temperature range over glass-transition temperature (hereinafter, referred to as "Tg"). It also exhibits good adhesiveness to a semiconductor chip, an organic substrate and a metal substrate. It also has the feature that it exhibits higher heat resistance in spite of its low crosslinking density.

The epoxy resin (F) may be, for example, a phenol biphenyl aralkyl type epoxy resin, but there are no particular restrictions as long as it has the structure of general formula (6).

In general formula (6), when n is within the above range, an epoxy resin composition exhibits improved curing properties and fluidity.

Silane Coupling Agent (G)

A silane coupling agent (G) used in Embodiment 3 may be a compound represented by general formula (9). In this embodiment, the silane coupling agent (G) is essential.

$$R3\text{-}NH\text{—}R4\text{-}Si(OR5)_nR6_{3-n} \quad (9)$$

wherein R3 is an organic group having 1 to 12 carbon atoms; R4, R5 and R6 are hydrocarbon having 1 to 12 carbon atoms and R3 to R6 are the same or different; and n is integer of 1 to 3.

Using the silane coupling agent (G) represented by general formula (9), viscosity of an epoxy resin composition is lowered and thus its fluidity is improved. A content of the silane coupling agent (G) is, but not limited to, 0.05 wt % to 1 wt % both inclusive, more preferably 0.1 wt % to 0.8 wt % both inclusive in the total epoxy resin composition. With the content of the silane coupling agent (G) within the range, a cured product exhibits good adhesiveness to a substrate. Furthermore, the epoxy resin composition is excellent in fluidity and curing properties. The silane coupling agent (G) represented by general formula (9) may be used alone or in combination of two or more.

As long as it does not deteriorate effects of using the silane coupling agent (G) represented by general formula (9), another coupling agent may be combined. Examples of a coupling agent which can be combined, include silane coupling agents such as epoxysilanes, mercaptosilanes, aminosilanes, alkylsilanes, ureidosilanes and vinylsilanes; titanate coupling agents; aluminum coupling agents; and aluminum/zirconium coupling agents.

Other Components

The epoxy resin composition of Embodiment 3 may contain, in addition to components (A) to (G), the additional components as described above.

The epoxy resin composition in Embodiment 3 can be prepared as described in Embodiment 1. Furthermore, the epoxy resin composition can be used to encapsulate an electronic part such as a semiconductor chip to prepare a semiconductor device as described in Embodiment 1.

Embodiment 4

An epoxy resin composition for encapsulating a semiconductor chip of Embodiment 4 contains the following components (A) to (F).

(A) a crystalline epoxy resin represented by general formula (4),
(B) a phenol resin represented by general formula (5),
(C-1) an epoxidized polybutadiene compound,
(D) an inorganic filler,
(E) a curing accelerator and
(F) an epoxy resin represented by general formula (6).

A weight ratio [(F)/(A)] of component (F) to component (A) is 10/90 to 90/10 both inclusive. Component (D) is contained in the amount of 80 wt % to 94 wt % both inclusive in the total epoxy resin composition. Furthermore, the epoxidized polybutadiene compound (C-1) is contained in the amount of 0.05 wt % to 5 wt % both inclusive in the total epoxy resin composition.

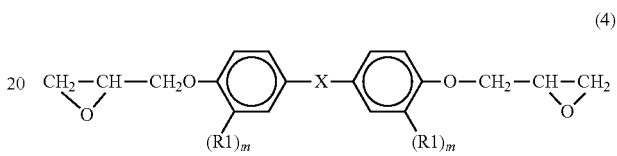

(4)

In general formula (4), X is group selected from single bond, —O—, —S— and —C(R2)$_2$—; R1s are alkyl having 1 to 6 carbon atoms and are the same or different; m is integer of 0 to 4; R2s are hydrogen or alkyl having 1 to 4 carbon atoms and are the same or different.

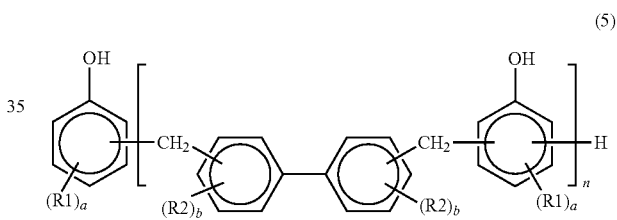

(5)

In general formula (5), R1 and R2 are hydrogen or alkyl having 1 to 4 carbon atoms and are the same or different; a is integer of 0 to 3; b is integer of 0 to 4; and n is average and is positive number of 1 to 5.

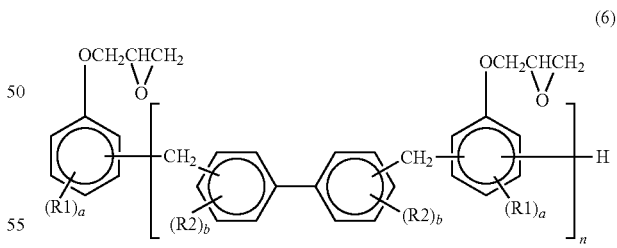

(6)

In general formula (6), R1 and R2 are hydrogen or alkyl having 1 to 4 carbon atoms and are the same or different; a is integer of 0 to 3; b is integer of 0 to 4; and n is average and is positive number of 1 to 5.

Such an epoxy resin composition can be used to provide a semiconductor device with reduced warpage and excellent soldering crack resistance. The epoxy resin composition is, therefore, particularly suitable for encapsulating an area mounting type semiconductor.

There will be specifically described Embodiment 4.

Crystalline Epoxy Resin (A)

A crystalline epoxy resin (A) used in Embodiment 4 may be the crystalline epoxy resin as described in Embodiment 3.

In Embodiment 4, the weight ratio [(F)/(A)] of the epoxy resin (F) to the crystalline epoxy resin (A) is 10/90 to 90/10 both inclusive, preferably 20/80 to 70/30 both inclusive, particularly preferably 30/70 to 50/50 both inclusive. When the weight ratio [(F)/(A)] is within the range, a cured product prepared from an epoxy resin composition exhibits lowered moisture absorbing rate. Furthermore, an inorganic filler can be contained in higher content in the epoxy resin composition. Thus, a cured product can exhibit lower moisture absorbing rate and higher strength.

In Embodiment 4, the additional epoxy resin as described in Embodiment 3 can be added as long as it does not deteriorate the features obtained by using the epoxy resin (F) and the crystalline epoxy resin (A). A content of the additional epoxy resin is, if any, preferably such that the epoxy resin (F) and the crystalline epoxy resin (A) amount to 70 wt % to 100 wt % both inclusive to the total epoxy resin. When the total amount of the epoxy resin (F) and the crystalline epoxy resin (A) is within the range, a cured product exhibits a reduced moisture-absorbing rate and further improved crack resistance.

Phenol Resin (B)

A phenol resin (B) used in Embodiment 4 may be the phenol resin represented by general formula (5) as described in Embodiment 3.

The above additional phenol resin may be combined as long as it does not deteriorate the features obtained by using the phenol resin (B) represented by general formula (5) used in this embodiment. A content of the additional phenol resin combined is preferably such that the content of the phenol resin (B) represented by general formula (5) is 70 wt % to 100 wt % both inclusive in the total phenol resin. With the content of the phenol resin (B) within the above range, a cured product has reduced moisture-absorption rate, and furthermore, exhibits excellent adhesiveness to a base material and soldering resistance after soldering.

An equivalence ratio of the number of epoxy groups in the total epoxy resin to the number of phenolic hydroxyl groups in the phenol resin, i.e., the epoxy number/the phenolic hydroxyl number, is preferably 0.7 to 1.5 both inclusive. With the ratio within the range, a resin component exhibits excellent curing properties. Furthermore, a cured product has increased glass-transition temperature and improved reliability in moisture resistance. When combining the epoxy resin (F) represented by general formula (6) and the crystalline epoxy resin (A) represented by general formula (4) with the phenol resin (B) represented by general formula (5), the highest effects can be achieved in crack resistance and warpage in soldering after moisture absorption.

Epoxidized Polybutadiene Compound (C-1)

An epoxidized polybutadiene compound (C-1) used in this embodiment may be the compound as described in Embodiment 1. Its content is preferably 0.05 wt % to 5 wt % both inclusive, particularly preferably 0.1 wt % to 2 wt % both inclusive to the total epoxy resin composition with the content within the range, an elastic modulus can be lowered and viscosity of the epoxy resin composition can be reduced.

The epoxidized polybutadiene compound (C-1) used in this embodiment preferably has the number average molecular weight of 500 to 4000 both inclusive. When the number average molecular weight is within the range, a cured product exhibits excellent soldering resistance, and furthermore, increase in viscosity of the epoxy resin composition can be prevented.

Inorganic Filler (D)

An inorganic filler (D) used in Embodiment 4 may be the filler as described in Embodiment 1. In the light of balance between moldability and reliability, the content of the total inorganic filler is preferably 80 wt % to 94 wt % both inclusive in the total epoxy resin composition. A content within the range may lead to prevention of curing shrinkage during molding/curing and thermal shrinkage from a molding temperature to room temperature, resulting in reduced warpage. Furthermore, moisture-absorption rate of a cured product is lowered and thus soldering crack resistance is improved. In addition, fluidity is improved, resulting in good moldability.

Curing Accelerator (E)

A curing accelerator (E) used in Embodiment 4 may be the compound as described in Embodiment 1.

Epoxy Resin (F)

An epoxy resin (F) used in Embodiment 4 may be the epoxy resin as described in Embodiment 3.

Other Components

An epoxy resin composition used in Embodiment 4 may contain, in addition to components (A) to (F), the additional components as described above. Furthermore, it may appropriately contain, if necessary, any of various additives including a coupling agent such as γ-glycidoxypropyltrimethoxysilane.

The epoxy resin composition used in this embodiment is prepared by blending components (A) to (F) and the other additives at ambient temperature using a mixer, melt-kneading the mixture using kneading means such as a roller mill, a kneader and an extruder, and cooling and then milling the mixture.

The epoxy resin composition of Embodiment 4 can be prepared as described in Embodiment 1. Furthermore, the epoxy resin composition can be used to encapsulate an electronic part such as a semiconductor chip to prepare a semiconductor device as described in Embodiment 1.

Embodiment 5

An epoxy resin composition for encapsulating a semiconductor chip of Embodiment 5 contains the following components (A) to (C-2) and (F).

(A) a crystalline epoxy resin represented by general formula (4), (B) a phenol resin represented by general formula (5), (C-2) a butadiene-acrylonitrile copolymer and (F) an epoxy resin represented by general formula (6).

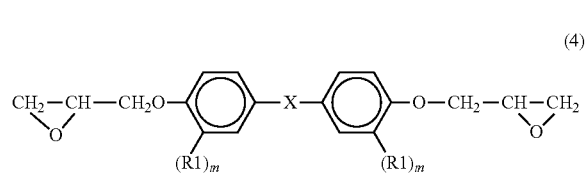

(4)

In general formula (4), X is group selected from single bond, —O—, —S— and —C(R2)$_2$—; R1s are alkyl having 1 to 6 carbon atoms and are the same or different; m is integer of 0 to 4; R2s are hydrogen or alkyl having 1 to 4 carbon atoms and are the same or different.

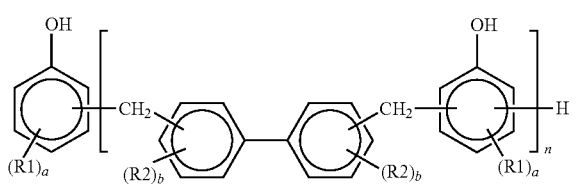

(5)

In general formula (5), R1 and R2 are hydrogen or alkyl having 1 to 4 carbon atoms and are the same or different; a is integer of 0 to 3; b is integer of 0 to 4; and n is average and is positive number of 1 to 5.

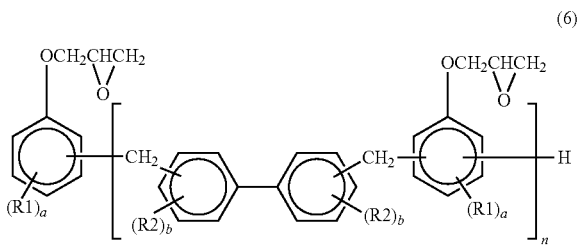

(6)

In general formula (6), R1 and R2 are hydrogen or alkyl having 1 to 4 carbon atoms and are the same or different; a is integer of 0 to 3; b is integer of 0 to 4; and n is average and is positive number of 1 to 5.

Such an epoxy resin composition may meet both higher content of an inorganic filler and higher fluidity. Thus, it can provide a significant effect that particularly an area mounting type semiconductor device can meet both reduction in warpage and higher reliability such as improved soldering resistance.

There will be specifically described Embodiment 5.

Crystalline Epoxy Resin (A)

A crystalline epoxy resin (A) used in Embodiment 5 may be the epoxy resin represented by general formula (4) as described in Embodiment 3.

In Embodiment 5, the weight ratio [(F)/(A)] of an epoxy resin (F) described later to the crystalline epoxy resin (A) is preferably 10/90 to 90/10 both inclusive, more preferably 20/80 to 70/30 both inclusive, particularly preferably 30/70 to 50/50 both inclusive. When the weight ratio [(F)/(A)] is within the above range, a cured product from the epoxy resin composition can exhibit lower moisture-absorbing rate and an inorganic filler can be added in high content without deterioration in fluidity of the epoxy resin composition during molding, resulting in excellent soldering resistance.

In Embodiment 5, the additional epoxy resin as described in Embodiment 3 can be added as long as it does not deteriorate the features obtained by using the epoxy resin (F) and the crystalline epoxy resin (A). A content of the additional epoxy resin is, if any, preferably such that the epoxy resin (F) and the crystalline epoxy resin (A) amount to 70 wt % to 100 wt % both inclusive to the total epoxy resin. When the total amount of the epoxy resin (F) and the crystalline epoxy resin (A) is within the range, a satisfactorily low moisture absorption and adequate soldering resistance can be achieved.

Phenol Resin (B)

A phenol resin (B) used in Embodiment 5 may be the phenol resin represented by general formula (5).

In this embodiment, as long as the effects obtained by using the phenol resin (B) are not deteriorated, the additional phenolic resin as described in Embodiment 3 can be added. A content of the additional phenolic resin combined is, if any, preferably such that the content of the phenol resin (B) is 40 wt % to 100 wt % both inclusive to the total phenolic resin. When the content of the phenol resin (B) is within the above range, a satisfactorily low moisture absorption and adequate soldering resistance can be achieved.

Butadiene-Acrylonitrile Copolymer (C-2)

A butadiene-acrylonitrile copolymer (C-2) used in Embodiment 5 may be, but not limited to, the compound represented by general formula (3) as described in Embodiment 2. A content of the butadiene-acrylonitrile copolymer (C-2) is preferably 0.05 to 0.5 wt % both inclusive, more preferably 0.1 to 0.3 wt % both inclusive in the total epoxy resin composition. A content within the above range can lead to improvement in adhesiveness of a cured product to a base material. Furthermore, fluidity of the epoxy resin composition is improved, so that it can be reliably filled during molding. In addition, since the epoxy resin composition becomes less viscous, for example, gold-wire deformation within a semiconductor device can be prevented.

Epoxy Resin (F)

An epoxy resin (F) used in Embodiment 5 may be the epoxy resin represented by general formula (6) as described in Embodiment 3.

An epoxy resin composition for encapsulating a semiconductor chip of this embodiment can contain, in addition to components (A) to (C-2) and (F) described above, an inorganic filler (D) and a curing accelerator (E).

Inorganic Filler (D)

An inorganic filler (D) used in Embodiment 5 may be the filler as described in Embodiment 1. A content of the inorganic filler (D) is preferably 80 wt % to 95 wt % both inclusive, more preferably 86 to 93 wt % both inclusive in the total epoxy resin composition. The content within the range may lead to prevention of soldering resistance from being deteriorated due to increase in moisture-absorbing rate and coefficient of thermal expansion. In addition, warpage of a cured product can be prevented. Furthermore, fluidity of an epoxy resin composition is improved and thus it can be reliably filled during molding. It allows for further lower viscosity, which can prevent problems such as gold-wire deformation within a semiconductor device.

Curing Accelerator (E)

A curing accelerator (E) used in Embodiment 5 may be the compound as described in Embodiment 3.

An epoxy resin composition of this embodiment can contain, in addition to components (A) to (F), the additional components described above. Furthermore, it can appropriately contain, if necessary, any of various additives including a silane coupling agent such as epoxysilanes, mercaptosilanes, aminosilanes, alkylsilanes, ureidosilanes and vinylsilanes and coupling agents such as titanate coupling agents, aluminum coupling agents and aluminum/zirconium coupling agents.

The epoxy resin composition of Embodiment 5 can be prepared as described in Embodiment 1. Furthermore, the epoxy resin composition can be used to encapsulate an electronic part such as a semiconductor chip to prepare a semiconductor device as described above.

EXAMPLES

This invention will be described with reference to, but not limited to, Examples. Here, any content shall be expressed as wt %.

Experimental Example A

Experimental Example a-1

Epoxy resin 1: a biphenyl type epoxy resin (Japan Epoxy Resins Co., Ltd., YX4000K, melting point: 105° C., epoxy equivalent: 185): 4.13 wt %

Phenol resin 1: a phenol aralkyl resin having a biphenylene moiety (Meiwa Plastic Industries, Ltd., MEH7851SS, softening point 65° C., hydroxyl equivalent 203): 4.54 wt %

Triphenylphosphine: 0.13 wt %

Fused spherical silica (average particle size: 30 μm): 90.00 wt %

Epoxidized polybutadiene compound 1 (Nippon Petrochemicals Company, Limited, E-1800-6.5, number average molecular weight: 1800, viscosity (25° C.): 350 Pa·s): 0.50 wt %

γ-Glycidylpropyltrimethoxysilane: 0.20 wt %

Carnauba wax: 0.20 wt %

Carbon black: 0.30 wt %

These components were blended by a mixer. Then, the mixture was kneaded using two rolls whose surface temperatures were 90° C. and 45° C. After cooling, the mixture was milled to give an epoxy resin composition. The epoxy resin composition thus obtained was evaluated by the following method. The results are shown in Table 1.

Evaluation Method

Spiral flow: determined mold temperature of 175° C., an injection pressure of 6.9 MPa and curing time of 2 min, using a mold for measuring a spiral flow in accordance with EMMI-1-66. It is expressed in units of centimeter.

Package warpage: a 352-pin BGA was formed using a transfer molding machine under the conditions of mold temperature: 175° C., an injection pressure: 6.9 MPa, curing time: 2 min, where a substrate was a bismaleimide-triazine resin/glass fabric substrate with thickness of 0.56 mm, a semiconductor device size was 30 mm×30 mm (thickness: 1.17 mm), a semiconductor chip size was 10 mm×10 mm (thickness: 0.35 mm), and a semiconductor chip was bound with a bonding pad in a circuit board via a gold wire with diameter of 25 μm. It was post-cured at 175° C. for 2 hours to give a sample. A set of ten semiconductor devices thus prepared was cooled to room temperature. Then, the displacement in height direction was measured in diagonal direction from the gate of the package, using a surface roughness gauge. The maximum displacement difference was determined as warpage in units of micrometer (μm).

Gold-wire deformation rate: a 352-pin BGA package formed for evaluating a package warpage was observed by a soft X-ray fluoroscope, to express a gold-wire deformation rate as rate of (flow amount)/(gold-wire length) in units of %.

Soldering resistance: a 352-pin BGA package formed for evaluating a package warpage was post-cured at 175° C. for 2 hours. A set of ten packages thus prepared were treated under the atmosphere of temperature of 60° C. and relative humidity of 60% for 168 hours, of temperature of 85° C. and relative humidity of 60% for 168 hours, and then of temperature of 85° C. and relative humidity of 85% for 72 hours. Then, the packages were subjected to IR reflow treatment at peak temperature of 260° C. (at 255° C. or higher for 10 sec.). After treatment, the presence of an internal detachment or crack was observed by an ultrasonic flaw detector, and defective semiconductor devices were counted. When the number of defective semiconductor devices was n, the rate was expressed as n/10.

Experimental Examples a-2 to a-11 and b-1 to b-7

In accordance with the compositions described in Tables 1 and 2, epoxy resin compositions were prepared and evaluated as described in Experimental Example a-1. The evaluation results are shown in Tables 1 and 2.

Components other than those used in Experimental Example a-1 are as follows.

Epoxy resin 2: an ortho-cresol novolac type epoxy resin (epoxy equivalent: 196, softening point: 55° C.)

Phenol resin 2: a phenol aralkyl resin having a phenylene moiety (Mitsui Chemicals Inc., XLC-LL, softening point: 75° C., hydroxyl equivalent: 175)

Phenol resin 3: a phenol novolac resin (softening point: 80° C., hydroxyl equivalent: 105)

1,8-Diazabicyclo(5,4,0)undecene-7 (hereinafter, referred to as "DBU")

Epoxidized polybutadiene compound 2 (an number average molecular weight: 700, viscosity (25° C.): 10 Pa·s)

Epoxidized polybutadiene compound 3 (an number average molecular weight: 2000, viscosity (25° C.): 550 Pa·s)

TABLE 1

| | | Experimental Example | | | | | | | | | | |
|---|---|---|---|---|---|---|---|---|---|---|---|---|
| | | a-1 | a-2 | a-3 | a-4 | a-5 | a-6 | a-7 | a-8 | a-9 | a-10 | a-11 |
| Epoxy resin 1 | | 4.13 | 3.20 | 5.07 | 4.31 | 3.64 | 2.10 | 4.31 | 4.95 | 4.13 | 4.13 | 4.13 |
| Epoxy resin 2 | | | | | | | 2.10 | | | | | |
| Phenol resin 1 | | 4.54 | 3.50 | 5.57 | 4.73 | 4.00 | 4.47 | 2.18 | 1.86 | 4.54 | 4.54 | 4.54 |
| Phenol resin 2 | | | | | | | | 2.18 | | | | |
| Phenol resin 3 | | | | | | | | | 1.86 | | | |
| Triphenylphosphine | | 0.13 | 0.10 | 0.16 | 0.16 | 0.16 | 0.13 | 0.13 | 0.13 | 0.13 | 0.13 | |
| DBU | | | | | | | | | | | | 0.13 |
| Fused spherical silica | | 90.00 | 92.00 | 88.00 | 90.00 | 90.00 | 90.00 | 90.00 | 90.00 | 90.00 | 90.00 | 90.00 |
| Epoxidized polybutadiene compound 1 | | 0.50 | 0.50 | 0.50 | 0.10 | 1.50 | 0.50 | 0.50 | 0.50 | | | 0.50 |
| Epoxidized polybutadiene compound 2 | | | | | | | | | | 0.50 | | |
| Epoxidized polybutadiene compound 3 | | | | | | | | | | | 0.50 | |
| γ-Glycidylpropyltrimethoxysilane | | 0.20 | 0.20 | 0.20 | 0.20 | 0.20 | 0.20 | 0.20 | 0.20 | 0.20 | 0.20 | 0.20 |
| Carnauba wax | | 0.20 | 0.20 | 0.20 | 0.20 | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 | 0.30 | 0.30 | 0.30 | 0.30 |
| Spiral flow | (cm) | 145 | 121 | 167 | 149 | 134 | 135 | 143 | 140 | 151 | 136 | 141 |
| Package warpage | (μm) | 38 | 14 | 54 | 36 | 42 | 38 | 36 | 35 | 37 | 39 | 39 |
| Gold wire deformation rate | (%) | 3 | 4 | 2 | 2 | 4 | 4 | 3 | 3 | 2 | 4 | 3 |

TABLE 1-continued

| | | Experimental Example | | | | | | | | | | |
|---|---|---|---|---|---|---|---|---|---|---|---|---|
| | | a-1 | a-2 | a-3 | a-4 | a-5 | a-6 | a-7 | a-8 | a-9 | a-10 | a-11 |
| Soldering resistance | after treatment at 60° C./60% for 168 hr | 0/10 | 0/10 | 0/10 | 0/10 | 0/10 | 0/10 | 0/10 | 0/10 | 0/10 | 0/10 | 0/10 |
| | after treatment at 85° C./60% for 168 hr | 0/10 | 0/10 | 2/10 | 1/10 | 0/10 | 2/10 | 1/10 | 2/10 | 1/10 | 0/10 | 0/10 |
| | after treatment at 85° C./85% for 72 hr | 2/10 | 0/10 | 4/10 | 3/10 | 0/10 | 5/10 | 3/10 | 5/10 | 2/10 | 1/10 | 2/10 |

TABLE 2

| | | Experimental Example | | | | | | |
|---|---|---|---|---|---|---|---|---|
| | | b-1 | b-2 | b-3 | b-4 | b-5 | b-6 | b-7 |
| Epoxy resin 1 | | 4.37 | 1.51 | 1.31 | 7.42 | | 4.46 | 5.53 |
| Epoxy resin 2 | | | | | | 4.26 | | |
| Phenol resin 1 | | 4.80 | 1.66 | 1.44 | 8.14 | 4.41 | | |
| Phenol resin 2 | | | | | | | 4.21 | |
| Phenol resin 3 | | | | | | | | 3.14 |
| Triphenylphosphine | | 0.13 | 0.13 | 0.05 | 0.24 | 0.13 | 0.13 | 0.13 |
| Fused spherical silica | | 90.00 | 90.00 | 96.00 | 83.00 | 90.00 | 90.00 | 90.00 |
| Epoxidized polybutadiene compound 1 | | | 6.00 | 0.50 | 0.50 | 0.50 | 0.50 | 0.50 |
| γ-Glycidylpropyltrimethoxysilane | | 0.20 | 0.20 | 0.20 | 0.20 | 0.20 | 0.20 | 0.20 |
| Carnauba wax | | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 |
| Spiral flow | (cm) | 150 | 87 | 35 | 230 | 64 | 149 | 156 |
| Package warpage | (μm) | 35 | 59 | unfilled | 112 | 40 | 37 | 36 |
| Gold wire deformation rate | (%) | 2 | 8 | unfilled | 1 | 10 | 2 | 2 |
| Soldering resistance | after treatment at 60° C./60% for 168 hr | 0/10 | 0/10 | unfilled | 7/10 | 0/10 | 1/10 | 2/10 |
| | after treatment at 85° C./60% for 168 hr | 4/10 | 0/10 | unfilled | 10/10 | 3/10 | 7/10 | 8/10 |
| | after treatment at 85° C./85% for 72 hr | 6/10 | 0/10 | unfilled | 10/10 | 6/10 | 10/10 | 10/10 |

Experimental Example B

Experimental Example a-1

Epoxy resin 1: a biphenyl type epoxy resin (Japan Epoxy Resins Co. Ltd., YX4000K, melting point: 105° C., epoxy equivalent: 185): 4.29 wt parts Phenol resin 1: a phenol aralkyl resin having a biphenylene moiety (Meiwa Plastic Industries, Ltd., MEH7851SS, softening point: 65° C., hydroxyl equivalent: 203): 4.71 wt parts Butadiene-acrylonitrile copolymer (Ube Industries, Ltd., HYCAR CTBN 1008-SP, x=0.82, y=0.18, z=62 (average)): 0.15 wt parts Triphenylphosphine: 0.15 wt parts Fused spherical silica (average particle size: 30 μm): 90.00 wt parts γ-Glycidylpropyltrimethoxysilane: 0.20 wt parts Carnauba wax: 0.20 wt parts Carbon black: 0.30 wt parts These components were blended by a mixer. Then, the mixture was kneaded using two rolls whose surface temperatures were 90° C. and 45° C. After cooling, the mixture was milled to give an epoxy resin composition. The epoxy resin composition thus obtained was evaluated by the following method. The results are shown in Table 3.

Evaluation Method

Spiral flow: measured under the conditions as described in Experimental Example A. A sample with a spiral flow of less than 100 cm was rejected.

Package warpage: measured under the conditions as described in Experimental Example A. A sample which was convex downward by 60 μm or more was determined as defective.

Gold-wire deformation rate: determined under the conditions as described in Experimental Example A. A sample with 3% or more was determined as defective.

Soldering resistance: a 352-pin BGA package formed under the conditions as described in terms of evaluating a package warpage was post-cured at 175° C. for 2 hours. A set of ten packages thus prepared were treated under the atmosphere of temperature of 60° C. and relative humidity of 60% for 168 hours or temperature of 85° C. and relative humidity of 60% for 168 hours. Then, the packages were subjected to IR reflow treatment at peak temperature of 260° C. (at 255° C. or higher for 10 sec.). After treatment, the presence of an internal detachment or crack was observed by an ultrasonic flaw detector and defective semiconductor devices were counted. When the number of defective semiconductor devices was n, the rate was expressed as n/10.

Experimental Examples a-2 to a-10 and b-1 to b-4

In accordance with the compositions described in Tables 3, 4 and 5, epoxy resin compositions were prepared and evaluated as described in Experimental Example a-1. The evaluation results are shown in Tables 3, 4 and 5.

Components other than those used in Experimental Example a-1 were as follows.

Epoxy resin 2: a triphenolmethane type epoxy resin (Japan Epoxy Resins Co. Ltd., E-1032H60, softening point: 59° C., epoxy equivalent: 169)

Phenol resin 2: a phenol aralkyl resin having a phenylene moiety (Mitsui Chemicals Inc., XLC-LL, softening point: 75° C., hydroxyl equivalent: 175)

Phenol resin 3: a phenol novolac resin (softening point: 80° C., hydroxyl equivalent: 105)

1,8-Diazabicyclo(5,4,0)undecene-7 (hereinafter, referred to as "DBU")

γ-Mercaptopropyltrimethoxysilane

TABLE 3

| | Experimental Example | | | | |
|---|---|---|---|---|---|
| | a-1 | a-2 | a-3 | a-4 | a-5 |
| Epoxy resin 1 | 4.29 | 3.30 | 5.16 | 4.40 | 4.95 |
| Phenol resin 1 | 4.71 | 3.73 | 5.81 | 2.30 | 2.03 |
| Phenol resin 2 | | | | 2.30 | |
| Phenol resin 3 | | | | | 2.03 |
| Butadiene-acrylonitrile copolymer | 0.15 | 0.15 | 0.15 | 0.15 | 0.15 |
| Triphenylphosphine | 0.15 | 0.12 | 0.18 | 0.15 | 0.15 |
| Fused spherical silica | 90.00 | 92.00 | 88.00 | 90.00 | 90.00 |
| γ-Glycidylpropyltrimethoxysilane | 0.20 | 0.20 | 0.20 | 0.20 | 0.20 |
| Carnauba wax | 0.20 | 0.20 | 0.20 | 0.20 | 0.20 |
| Carbon black | 0.30 | 0.30 | 0.30 | 0.30 | 0.30 |
| Spiral flow (cm) | 150 | 126 | 185 | 160 | 155 |
| Package warpage (μm) | 35 | 15 | 50 | 33 | 32 |
| Gold wire deformation rate (%) | 1.5 | 2.7 | 0.9 | 1.3 | 1.5 |
| Soldering resistance after treatment at 60° C./60% for 168 hr | 0/10 | 0/10 | 0/10 | 0/10 | 0/10 |
| after treatment at 85° C./60% for 168 hr | 0/10 | 0/10 | 0/10 | 0/10 | 0/10 |

TABLE 4

| | Experimental Example | | | | |
|---|---|---|---|---|---|
| | a-6 | a-7 | a-8 | a-9 | a-10 |
| Epoxy resin 1 | 3.40 | 4.25 | 4.16 | 4.29 | 4.29 |
| Epoxy resin 2 | 0.85 | | | | |
| Phenol resin 1 | 4.75 | 4.80 | 4.69 | 4.71 | 4.71 |
| Butadiene-acrylonitrile copolymer | 0.15 | 0.10 | 0.30 | 0.15 | 0.15 |
| Triphenylphosphine | 0.15 | 0.15 | 0.15 | 0.15 | |
| DBU | | | | | 0.15 |
| Fused spherical silica | 90.00 | 90.00 | 90.00 | 90.00 | 90.00 |
| γ-Glycidylpropyltrimethoxysilane | 0.20 | 0.20 | 0.20 | | 0.20 |
| γ-Mercaptopropyltrimethoxysilane | | | | 0.20 | |
| Carnauba wax | 0.20 | 0.20 | 0.20 | 0.20 | 0.20 |
| Carbon black | 0.30 | 0.30 | 0.30 | 0.30 | 0.30 |
| Spiral flow (cm) | 121 | 160 | 130 | 155 | 125 |
| Package warpage (μm) | 12 | 37 | 25 | 35 | 26 |
| Gold wire deformation rate (%) | 2.8 | 1.2 | 2.5 | 1.2 | 2.5 |
| Soldering resistance after treatment at 60° C./60% for 168 hr | 0/10 | 0/10 | 0/10 | 0/10 | 0/10 |
| after treatment at 85° C./60% for 168 hr | 0/10 | 0/10 | 0/10 | 0/10 | 0/10 |

TABLE 5

| | Experimental Example | | | |
|---|---|---|---|---|
| | b-1 | b-2 | b-3 | b-4 |
| Epoxy resin 1 | 4.59 | 5.76 | | 4.31 |
| Epoxy resin 2 | | | 4.09 | |
| Phenol resin 1 | | | 4.91 | 4.84 |
| Phenol resin 2 | 4.41 | | | |
| Phenol resin 3 | | 3.24 | | |
| Butadiene-acrylonitrile copolymer | 0.15 | 0.15 | 0.15 | |
| Triphenylphosphine | 0.15 | 0.15 | 0.15 | 0.15 |
| Fused spherical silica | 90.00 | 90.00 | 90.00 | 90.00 |
| γ-Glycidylpropyltrimethoxysilane | 0.20 | 0.20 | 0.20 | 0.20 |
| Carnauba wax | 0.20 | 0.20 | 0.20 | 0.20 |
| Carbon black | 0.30 | 0.30 | 0.30 | 0.30 |
| Spiral flow (cm) | 155 | 154 | 82 | 95 |
| Package warpage (μm) | 31 | 32 | 5 | 37 |
| Gold wire deformation rate (%) | 1.7 | 3.0 | 9.0 | 5.0 |
| Soldering resistance after treatment at 60° C./60% for 168 hr | 1/10 | 1/10 | 1/10 | 5/10 |
| after treatment at 85° C./60% for 168 hr | 5/10 | 7/10 | 3/10 | 10/10 |

Experimental Example C

Experimental Example a-1

Epoxy resin 1: a phenol biphenyl aralkyl type epoxy resin (Nippon Kayaku Co. Ltd., NC3000P, epoxy equivalent: 274, softening point: 58° C.): 1.47 wt parts Epoxy resin 2: bisphenol-A type crystalline epoxy resin (Japan Epoxy Resins Co. Ltd., YL6810, epoxy equivalent: 171, melting point: 45° C.): 3.41 wt parts Phenol resin 1: a phenol biphenyl aralkyl resin (Meiwa Plastic Industries, Ltd., MEH-7851SS, hydroxyl equivalent: 203, softening point: 65° C.): 5.12 wt parts Triphenylphosphine: 0.15 wt parts Spherical fused silica (average particle size: 30 μm): 88.85 wt parts Polybutadiene 1 (viscosity at 25° C.: 350 Pa·s, oxirane-oxygen content: 6.5%): 0.30 wt parts N-Phenyl γ-aminopropyltrimethoxysilane: 0.20 wt parts Carnauba wax: 0.20 wt parts Carbon black: 0.30 wt parts These components were blended at ambient temperature by a mixer. The mixture was kneaded using two rolls at 70 to 120° C. After cooling, the mixture was milled to give an epoxy resin composition. Epoxy resin compositions thus obtained were evaluated as described below. The results are shown in Table 6.

Evaluation Method

Spiral flow: measured under the conditions as described in Experimental Example A.

MAP molding (unfilled void): MAP-QFN (metal substrate: a copper frame plated with nickel-palladium-gold, encapsulating-area size: 45 mm×62 mm, thickness: 0.65 mm, size of a semiconductor device (QFN-16L) piece: 4.0 mm×4.0 mm, semiconductor-element size: 1.5 mm×1.5 mm, thickness: 0.2 mm, passivation type: SiN) was molded under the conditions of mold temperature: 175° C., an injection pressure: 6.9 MPa and curing time: 90 sec using a transfer molding machine. Unfilled voids are counted.

Package warpage: for the MAP-QFN formed for evaluating MAP molding (unfilled void), the displacement in height direction was in longitudinal direction using a surface roughness gauge. The maximum displacement difference was determined as package warpage in units of micrometer (μm).

Soldering crack resistance: the above MAP-QFN was formed and post-cured at 175° C. for 4 hours. It was then cut into individual pieces to obtain semiconductor device (QFN-16L) samples. A set of twenty samples was individually treated under the conditions of temperature of 60° C. and relative humidity of 60% for 120 hours and of temperature of 85° C. and relative humidity of 60% for 168 hours. Then, the samples were treated by IR reflow (260° C.) for 10 sec. Using an ultrasonic flaw detector, the samples were observed to determine the presence of various interface detachments. When the number of defective packages, in which detachment occurs, is n, the rate is expressed as n/20.

Experimental Examples a-2 to a-12 and b-1 to b-9

In accordance with the compositions described in Tables 6 and 7, epoxy resin compositions were prepared and evaluated as described in Experimental Example a-1. The evaluation results are shown in Tables 6 and 7. Components other than those used in Experimental Example a-1 are as follows.

Epoxy resin 3: a biphenyl type epoxy resin (Japan Epoxy Resins Co. Ltd., YX4000K, softening point: 105° C., epoxy equivalent: 185)

Phenol resin 2: a phenol aralkyl resin (Mitsui Chemicals Inc., XLC-LL, softening point: 75° C., hydroxyl equivalent: 175)

γ-Glycidylpropyltrimethoxysilane

Polybutadienes 2 to 6

An oxirane-oxygen content and viscosity at 25° C. for a polybutadiene are shown in Table 8.

TABLE 6

| | | Experimental Example | | | | | | | | | | | |
|---|---|---|---|---|---|---|---|---|---|---|---|---|---|
| | | a-1 | a-2 | a-3 | a-4 | a-5 | a-6 | a-7 | a-8 | a-9 | a-10 | a-11 | a-12 |
| Epoxy resin 1 | | 1.47 | 2.55 | 0.50 | 4.97 | 2.53 | 2.01 | 1.47 | 1.47 | 1.33 | 1.47 | 1.38 | 1.47 |
| Epoxy resin 2 | | 3.41 | 2.55 | 4.18 | 0.62 | 2.53 | 2.98 | 3.41 | 3.41 | 3.07 | 3.41 | 3.21 | 3.41 |
| Epoxy resin 3 | | | | | | 0.55 | | | | | | | |
| Phenol resin 1 | | 5.12 | 4.90 | 5.32 | 4.41 | 4.60 | 4.00 | 5.12 | 5.12 | 4.60 | 5.12 | 4.81 | 5.12 |
| Phenol resin 2 | | | | | | | 1.01 | | | | | | |
| Triphenylphosphine | | 0.15 | 0.15 | 0.15 | 0.15 | 0.15 | 0.15 | 0.15 | 0.15 | 0.15 | 0.15 | 0.15 | 0.15 |
| Spherical fused silica | | 88.85 | 88.85 | 88.85 | 88.85 | 88.85 | 88.85 | 88.85 | 88.85 | 88.85 | 89.07 | 88.85 | 88.97 |
| Polybutadiene 1 | | 0.30 | 0.30 | 0.30 | 0.30 | 0.30 | 0.30 | | | 1.30 | 0.08 | 0.30 | 0.30 |
| Polybutadiene 2 | | | | | | | | 0.30 | | | | | |
| Polybutadiene 3 | | | | | | | | | 0.30 | | | | |
| Polybutadiene 4 | | | | | | | | | | | | | |
| Polybutadiene 5 | | | | | | | | | | | | | |
| Polybutadiene 6 | | | | | | | | | | | | | |
| N-Phenyl γ-aminopropyl-trimethoxysilane | | 0.20 | 0.20 | 0.20 | 0.20 | 0.20 | 0.20 | 0.20 | 0.20 | 0.20 | 0.20 | 0.80 | 0.08 |
| γ-Glycidylpropyl-trimethoxysilane | | | | | | | | | | | | | |
| Carnauba wax | | 0.20 | 0.20 | 0.20 | 0.20 | 0.20 | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 | 0.30 | 0.30 | 0.30 | 0.30 | 0.30 |
| Spiral flow | (cm) | 110 | 100 | 140 | 92 | 113 | 110 | 123 | 95 | 93 | 101 | 95 | 100 |
| MAP molding (unfilled void) | (number) | 0 | 0 | 0 | 0 | 0 | 0 | 0 | 0 | 0 | 0 | 0 | 0 |
| MAP warpage | (μm) | 200 | 180 | 300 | 150 | 250 | 220 | 200 | 210 | 160 | 200 | 220 | 200 |
| Soldering resistance | (60° C./60%/120 hr) | 0/20 | 0/20 | 0/20 | 0/20 | 0/20 | 0/20 | 0/20 | 0/20 | 0/20 | 0/20 | 0/20 | 0/10 |
| | (85° C./60%/168 hr) | 2/20 | 3/20 | 1/20 | 4/20 | 3/20 | 3/20 | 3/20 | 1/20 | 3/20 | 4/20 | 1/20 | 5/20 |

TABLE 7

| | Experimental Example | | | | | | | | |
|---|---|---|---|---|---|---|---|---|---|
| | b-1 | b-2 | b-3 | b-4 | b-5 | b-6 | b-7 | b-8 | b-9 |
| Epoxy resin 1 | 5.75 | | 2.00 | 2.36 | 0.47 | 1.47 | 1.47 | 1.47 | 1.47 |
| Epoxy resin 2 | | 4.59 | 2.90 | 5.46 | 1.00 | 3.41 | 3.41 | 3.41 | 3.41 |
| Epoxy resin 3 | | | | | | | | | |
| Phenol resin 1 | 4.25 | 5.41 | | 8.18 | 1.53 | 5.12 | 5.12 | 5.12 | 5.12 |
| Phenol resin 2 | | | 5.10 | | | | | | |
| Triphenylphosphine | 0.15 | 0.15 | 0.15 | 0.15 | 0.15 | 0.15 | 0.15 | 0.15 | 0.15 |
| Spherical fused silica | 88.85 | 88.85 | 88.85 | 82.85 | 95.85 | 88.85 | 88.85 | 88.85 | 88.85 |

TABLE 7-continued

| | | b-1 | b-2 | b-3 | b-4 | b-5 | b-6 | b-7 | b-8 | b-9 |
|---|---|---|---|---|---|---|---|---|---|---|
| | | | | | Experimental Example | | | | | |
| Polybutadiene 1 | | 0.30 | 0.30 | 0.30 | 0.30 | 0.30 | | | | 0.30 |
| Polybutadiene 2 | | | | | | | | | | |
| Polybutadiene 3 | | | | | | | | | | |
| Polybutadiene 4 | | | | | | | 0.30 | | | |
| Polybutadiene 5 | | | | | | | | 0.30 | | |
| Polybutadiene 6 | | | | | | | | | 0.30 | |
| N-Phenyl γ-aminopropyl-trimethoxysilane | | 0.20 | 0.20 | 0.20 | 0.20 | 0.20 | 0.20 | 0.20 | 0.20 | |
| γ-Glycidylpropyl-trimethoxysilane | | | | | | | | | | 0.20 |
| Carnauba wax | | 0.20 | 0.20 | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 | 0.30 | 0.30 |
| Spiral flow | (cm) | 78 | 155 | 100 | 110 | 30 | 78 | 130 | 60 | 110 |
| MAP molding (unfilled void) | (number) | 5 | 0 | 0 | 0 | >20 | 8 | 0 | 20 | 0 |
| MAP warpage | (μm) | 140 | 350 | 240 | 400 | (*1) | 200 | 250 | 200 | 200 |
| Soldering resistance | (60° C./60%/120 hr) | 0/20 | 0/20 | 0/20 | 0/20 | (*1) | 0/20 | 0/20 | 0/20 | 4/20 |
| | (85° C./60%/168 hr) | 2/20 | 2/20 | 8/20 | 2/20 | (*1) | 2/20 | 9/20 | 2/20 | 20/20 |

Note:
(*1); no evaluation samples were not obtained due to unfilling

TABLE 8

| | | Polybutadiene | | | | | |
|---|---|---|---|---|---|---|---|
| | | 1 | 2 | 3 | 4 | 5 | 6 |
| Oxirane-oxygen rate | % | 6.5 | 5 | 8 | 9 | 2 | 11 |
| Viscosity at 25° C. | Pa·s | 350 | 200 | 550 | 750 | 10 | 900 |

Experimental Example D

Experimental Example a-1

Epoxy resin 1: a phenol biphenyl aralkyl type epoxy resin (Nippon Kayaku Co. Ltd., NC3000P, epoxy equivalent: 274, softening point: 58° C.): 1.90 wt parts Epoxy resin 2: a bisphenol-A type crystalline epoxy resin (Japan Epoxy Resins Co. Ltd., YL6810, epoxy equivalent: 171, melting point: 45° C.): 2.85 wt parts Phenol resin 1: a phenol biphenyl aralkyl resin (Meiwa Plastic Industries, Ltd., MEH-7851SS, hydroxyl equivalent: 203, softening point: 65° C.): 4.65 wt parts Triphenylphosphine: 0.20 wt parts Spherical fused silica (average particle size: 30 μm): 89.00 wt parts Epoxidized polybutadiene compound 1: Nippon Petrochemicals Co. Ltd., E-1800-6.5, number average molecular weight: 1800, viscosity (25° C.): 350 Pa·s: 0.50 wt parts γ-Mercaptopropyltrimethoxysilane: 0.40 wt parts Carnauba wax: 0.20 wt parts Carbon black: 0.30 wt parts These components were blended at ambient temperature by a mixer. The mixture was kneaded using two rolls at 70 to 120° C. After cooling, the mixture was milled to give an epoxy resin composition. Epoxy resin compositions thus obtained were evaluated as described below. The results are shown in Table 9.
Evaluation Method Spiral flow: measured under the conditions as described in Experimental Example A. When a spiral flow is less than 90 cm, fluidity is so low that defects such as unfilling may occur during molding a package.

Package warpage: a 352p BGA was formed using a transfer molding machine under the conditions of mold temperature: 175° C., an injection pressure: 6.9 MPa, curing time: 90 sec, where a substrate was a bismaleimide-triazine resin/glass fabric substrate with thickness of 0.56 mm, a semiconductor device size was 30 mm×30 mm (thickness: 1.17 mm), a semiconductor chip size was 15 mm×15 mm (thickness: 0.35 mm). It was post-cured at 175° C. for 2 hours. After cooling to room temperature, the displacement in height direction was measured in diagonal direction from the gate of the package, using a surface roughness gauge. The maximum displacement difference was determined as a package warpage in units of micrometer (μm). When a package warpage in this package is 70 μm or more, the composition is not suitable as an encapsulator for encapsulating one side.

Gold-wire deformation rate: measured under the conditions as described in Experimental Example A. When a gold-wire deformation rate is 4% or more, short-circuit tends to occur due to contact between gold wires.

Soldering resistance: a 352pBGA was formed as described for evaluating a package warpage and post-cured at 175° C. for 2 hours, to obtain samples. A set of ten samples were individually wetted under the conditions of temperature of 60° C. and relative humidity of 60% for 168 hours and of temperature of 85° C. and relative humidity of 60% for 168 hours, and treated by IR reflow (260° C.) for 10 sec. The samples were evaluated for the presence of inner cracks and various interface detachment by observing them by an ultrasonic flaw detector. When the number of defective packages is n, the rate is expressed as n/10. When the number of defective packages is 3 or less, the sample passes the soldering resistance evaluation test.

Experimental Examples a-2 to a-26

In accordance with the compositions described in Tables 9, and 11, epoxy resin compositions were prepared and evaluated as described in Experimental Example a-1. The evaluation results are shown in Tables 9, 10 and 11. Components other than those used in Experimental Example a-1 are as follows.

Epoxy resin 3: an ortho-cresol novolac type epoxy resin (Nippon Kayaku Co. Ltd., EOCN-1020-55, epoxy equivalent: 196, softening point: 55° C.)

Phenol resin 2: a phenol phenyl aralkyl resin (Mitsui Chemicals Inc., XLC-LL, softening point: 75° C., hydroxyl equivalent: 175)

1,8-Diazabicyclo(5,4,0)undecene-7 (hereinafter, referred to as "DBU").

Epoxidized polybutadiene compound 2: a compound represented by general formula (4), wherein k, l, m and n are integer of 1 to 3; R1 has structure represented by $C_pH_q$; p is integer of 0 to 3; and q is integer of 1 to 8, number average molecular weight: 400, viscosity (25° C.): 150 Pa·s Epoxidized polybutadiene compound 3: a compound represented by general formula (4), wherein k, l, m and n are integer of 1 to 100; R1 has structure represented by $C_pH_q$; p is integer of 0 to 10; and q is integer of 1 to 21, number average molecular weight: 4500, viscosity (25° C.): 800 Pa·s

TABLE 9

| | | a-1 | a-2 | a-3 | a-4 | a-5 | a-6 | a-7 | a-8 | a-9 |
|---|---|---|---|---|---|---|---|---|---|---|
| Epoxy resin 1 | | 1.90 | 0.91 | | 3.56 | 5.47 | 1.42 | 1.13 | 1.93 | 1.94 |
| Epoxy resin 2 | | 2.85 | 3.64 | 4.37 | 1.53 | | 2.13 | 1.70 | 2.90 | 2.91 |
| Epoxy resin 3 | | | | | | | 1.18 | 1.89 | | |
| Phenol resin 1 | | 4.65 | 4.85 | 5.03 | 4.31 | 3.93 | 4.67 | 4.68 | 3.43 | 2.73 |
| Phenol resin 2 | | | | | | | | | 1.14 | 1.82 |
| Triphenylphosphine | | 0.20 | 0.20 | 0.20 | 0.20 | 0.20 | 0.20 | 0.20 | 0.20 | 0.20 |
| DBU | | | | | | | | | | |
| Spherical fused silica | | 89.00 | 89.00 | 89.00 | 89.00 | 89.00 | 89.00 | 89.00 | 89.00 | 89.00 |
| Epoxidized polybutadiene compound 1 | | 0.50 | 0.50 | 0.50 | 0.50 | 0.50 | 0.50 | 0.50 | 0.50 | 0.50 |
| Epoxidized polybutadiene compound 2 | | | | | | | | | | |
| Epoxidized polybutadiene compound 3 | | | | | | | | | | |
| γ-Mercaptopropyltrimethoxysilane | | 0.40 | 0.40 | 0.40 | 0.40 | 0.40 | 0.40 | 0.40 | 0.40 | 0.40 |
| γ-Glycidylpropyltrimethoxysilane | | | | | | | | | | |
| Carnauba wax | | 0.20 | 0.20 | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 | 0.30 | 0.30 |
| Spiral flow | (cm) | 120 | 135 | 130 | 100 | 90 | 130 | 115 | 130 | 125 |
| Package warpage | (μm) | 50 | 67 | 79 | 43 | 53 | 57 | 64 | 56 | 57 |
| Gold wire deformation rate | (%) | 2 | 1 | 2 | 3 | 5 | 2 | 3 | 2 | 2 |
| Soldering resistance | after treatment at 60° C./60% for 168 hr | 0/10 | 0/10 | 10/10 | 0/10 | 0/10 | 0/10 | 5/10 | 0/10 | 7/10 |
| | after treatment at 85° C./60% for 168 hr | 0/10 | 0/10 | 10/10 | 0/10 | 0/10 | 1/10 | 6/10 | 1/10 | 9/10 |

TABLE 10

| | | a-10 | a-11 | a-12 | a-13 | a-14 | a-15 | a-16 | a-17 | a-18 |
|---|---|---|---|---|---|---|---|---|---|---|
| Epoxy resin 1 | | 1.98 | 2.00 | 2.00 | 1.09 | 0.79 | 1.90 | 1.90 | 1.90 | 1.90 |
| Epoxy resin 2 | | 2.97 | 3.00 | 3.00 | 1.64 | 1.18 | 2.85 | 2.85 | 2.85 | 2.85 |
| Epoxy resin 3 | | | | | | | | | | |
| Phenol resin 1 | | 4.85 | 4.89 | 4.89 | 2.67 | 1.93 | 4.65 | 4.65 | 4.65 | 4.65 |
| Phenol resin 2 | | | | | | | | | | |
| Triphenylphosphine | | 0.20 | 0.20 | 0.20 | 0.20 | 0.20 | 0.20 | 0.20 | 0.20 | |
| DBU | | | | | | | | | | 0.20 |
| Spherical fused silica | | 89.00 | 89.00 | 89.00 | 89.00 | 89.00 | 89.00 | 89.00 | 89.00 | 89.00 |
| Epoxidized polybutadiene compound 1 | | 0.10 | 0.008 | | 4.50 | 6.00 | | | 0.50 | 0.50 |
| Epoxidized polybutadiene compound 2 | | | | | | | 0.50 | | | |
| Epoxidized polybutadiene compound 3 | | | | | | | | 0.50 | | |
| γ-Mercaptopropyltrimethoxysilane | | 0.40 | 0.40 | 0.40 | 0.40 | 0.40 | 0.40 | 0.40 | | 0.40 |
| γ-Glycidylpropyltrimethoxysilane | | | | | | | | | 0.40 | |
| Carnauba wax | | 0.20 | 0.20 | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 | 0.30 | 0.30 |
| Spiral flow | (cm) | 130 | 158 | 155 | 105 | 90 | 120 | 90 | 115 | 115 |
| Package warpage | (μm) | 44 | 50 | 50 | 64 | 79 | 72 | 100 | 53 | 53 |
| Gold-linewire deformation rate | (%) | 2 | 2 | 2 | 3 | 5 | 3 | 5 | 3 | 3 |
| Soldering resistance | after treatment at 60° C./60% for 168 hr | 0/10 | 5/10 | 4/10 | 0/10 | 1/10 | 6/10 | 2/10 | 0/10 | 0/10 |
| | after treatment at 85° C./60% for 168 hr | 2/10 | 6/10 | 5/10 | 1/10 | 2/10 | 8/10 | 3/10 | 0/10 | 0/10 |

TABLE 11

| | a-19 | a-20 | a-21 | a-22 | a-23 | a-24 | a-25 | a-26 |
|---|---|---|---|---|---|---|---|---|
| Epoxy resin 1 | 3.12 | 4.13 | 1.09 | 0.49 | 1.69 | 1.41 | 2.21 | 2.31 |
| Epoxy resin 2 | 4.67 | 6.19 | 1.64 | 0.73 | 2.54 | 2.11 | 3.32 | 3.47 |
| Epoxy resin 3 | | | | | | | | |
| Phenol resin 1 | 7.61 | 10.09 | 2.67 | 1.19 | 5.17 | 5.88 | 3.87 | 3.62 |
| Phenol resin 2 | | | | | | | | |
| Triphenylphosphine | 0.20 | 0.20 | 0.20 | 0.20 | 0.20 | 0.20 | 0.20 | 0.20 |
| DBU | | | | | | | | |
| Spherical fused silica | 83.00 | 78.00 | 93.00 | 96.00 | 89.00 | 89.00 | 89.00 | 89.00 |
| Epoxidized polybutadiene compound 1 | 0.50 | 0.50 | 0.50 | 0.50 | 0.50 | 0.50 | 0.50 | 0.50 |
| Epoxidized polybutadiene compound 2 | | | | | | | | |
| Epoxidized polybutadiene compound 3 | | | | | | | | |
| γ-Mercaptopropyltrimethoxysilane | 0.40 | 0.40 | 0.40 | 0.40 | 0.40 | 0.40 | 0.40 | 0.40 |
| γ-Glycidylpropyltrimethoxysilane | | | | | | | | |
| Carnauba wax | 0.20 | 0.20 | 0.20 | 0.20 | 0.20 | 0.20 | 0.20 | 0.20 |
| Carbon black | 0.30 | 0.30 | 0.30 | 0.30 | 0.30 | 0.30 | 0.30 | 0.30 |
| Spiral flow (cm) | 140 | >260 | 95 | 30 | 100 | 90 | 140 | 130 |
| Package warpage (μm) | 64 | 114 | 41 | unfilled | 56 | 114 | 64 | 107 |
| Gold wire deformation rate (%) | 1 | 1 | 3 | unfilled | 2 | 5 | 1 | 2 |
| Soldering resistance after treatment at 60° C./60% for 168 hr | 0/10 | 10/10 | 0/10 | unfilled | 0/10 | 10/10 | 0/10 | 10/10 |
| after treatment at 85° C./60% for 168 hr | 2/10 | 10/10 | 3/10 | unfilled | 3/10 | 10/10 | 2/10 | 10/10 |

Experimental Example E

Experimental Example a-1

Epoxy resin 1: a phenol biphenyl aralkyl type epoxy resin (Nippon Kayaku Co. Ltd., NC3000, epoxy equivalent: 274, softening point: 58° C.): 2.55 wt parts Epoxy resin 2: a bisphenol-A type crystalline epoxy resin (Japan Epoxy Resins Co. Ltd., YL6810, epoxy equivalent: 171, melting point: 45° C.): 2.56 wt parts Phenolic resin 1: a phenol biphenyl aralkyl resin (Meiwa Plastic Industries, Ltd., MEH-7851SS, hydroxyl equivalent: 203, softening point: 65° C.): 4.89 wt parts Butadiene-acrylonitrile copolymer 1 (Ube Industries, Ltd., HYCAR CTBN 1008-SP; in general formula (3), x=0.82, y=0.18, z is 62 (the average)): 0.15 wt parts

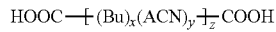

$$\text{HOOC} - [(\text{Bu})_x(\text{ACN})_y]_z - \text{COOH} \quad (3)$$

Triphenylphosphine: 0.15 wt parts

Fused spherical silica (average particle size: 30 μm): 89.00 wt parts

γ-Glycidylpropyltrimethoxysilane: 0.20 wt parts

Carnauba wax: 0.20 wt parts

Carbon black: 0.30 wt parts

These components were blended by a mixer. Then, the mixture was kneaded using two rolls whose surface temperatures were 90° C. and 45° C. After cooling, the mixture was milled to give an epoxy resin composition. The epoxy resin composition thus obtained was evaluated by the following method. The results are shown in Table 12.

Evaluation Method

Spiral flow: measured under the conditions as described in Experimental Example A. A sample with a spiral flow of less than 90 cm was rejected.

Package warpage: measured under the conditions as described in Experimental Example A. A sample with warpage of 60 μm or more was determined as defective.

Gold-wire deformation rate: determined under the conditions as described in Experimental Example A. A sample with 3% or more was determined as defective.

Soldering resistance: a 352-pin BGA package formed under the conditions as described in terms of evaluating a package warpage was post-cured at 175° C. for 2 hours. A set of ten packages thus prepared were treated under the atmosphere of temperature of 60° C. and relative humidity of 60% for 168 hours or temperature of 85° C. and relative humidity of 60% for 168 hours. Then, the packages were subjected to IR reflow treatment at peak temperature of 260° C. (at 255° C. or higher for 10 sec.). After treatment, the presence of an internal detachment or crack was observed by an ultrasonic flaw detector, and defective semiconductor devices were counted. When the number of defective semiconductor devices was n, the rate was expressed as n/10.

Experimental Examples a-2 to a-22

In accordance with the compositions described in Tables 12, 13 and 14, epoxy resin compositions were prepared and evaluated as described in Experimental Example a-1. The evaluation results are shown in Tables 12, 13 and 14.

Components other than those used in Experimental Example a-1 were as follows.

Epoxy resin 3: a ortho-cresol novolac type epoxy resin (Nippon Kayaku Co. Ltd., EOCN-1020-55, epoxy equivalent: 196, softening point: 55° C.)

Phenolic resin 2: a phenolic resin represented by general formula (12) (Tohto Kasei Co., Ltd., SN-485, softening point: 87° C., hydroxyl equivalent: 210)

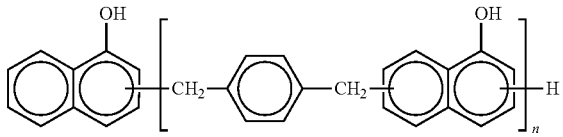

(12)

Phenolic resin 3: a phenol aralkyl resin having a phenylene moiety (Mitsui Chemicals Inc., XLC-LL, softening point: 75° C., hydroxyl equivalent: 175)

Phenolic resin 4: a phenol novolac resin (softening point: 80° C., hydroxyl equivalent: 105)

Butadiene-acrylonitrile copolymer 2 (Ube Industries, Ltd., HYCAR CTBN 1300×13; in general formula (3), x=0.74, y=0.26, z=54 (the average))

$$HOOC\text{---}[(Bu)_x(ACN)_y]_z\text{---}COOH \quad (3)$$

1,8-Diazabicyclo(5,4,0)undecene-7 (hereinafter, referred to as "DBU")

γ-Mercaptopropyltrimethoxysilane

TABLE 12

| | | Experimental Example | | | | | | |
|---|---|---|---|---|---|---|---|---|
| | | a-1 | a-2 | a-3 | a-4 | a-5 | a-6 | a-7 |
| Epoxy resin 1 | | 2.55 | 1.80 | 3.31 | 2.03 | 2.53 | 2.63 | 3.02 |
| Epoxy resin 2 | | 2.56 | 1.79 | 3.31 | 2.03 | 2.53 | 2.63 | 3.02 |
| Epoxy resin 3 | | | | | 1.01 | | | |
| Phenol resin 1 | | 4.89 | 3.44 | 6.35 | 4.93 | 2.47 | 3.32 | 1.98 |
| Phenol resin 2 | | | | | | 2.47 | | |
| Phenol resin 3 | | | | | | | 1.42 | |
| Phenol resin 4 | | | | | | | | 1.98 |
| Butadiene-acrylonitrile copolymer 1 | | 0.15 | 0.15 | 0.15 | 0.15 | 0.15 | 0.15 | 0.15 |
| Triphenylphosphine | | 0.15 | 0.12 | 0.18 | 0.15 | 0.15 | 0.15 | 0.15 |
| Spherical fused silica | | 89.00 | 92.00 | 86.00 | 89.00 | 89.00 | 89.00 | 89.00 |
| γ-Glycidylpropyltrimethoxysilane | | 0.20 | 0.20 | 0.20 | 0.20 | 0.20 | 0.20 | 0.20 |
| Carnauba wax | | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 |
| Spiral flow | (cm) | 120 | 95 | 143 | 100 | 110 | 120 | 135 |
| Package warpage | (μm) | 40 | 27 | 55 | 50 | 40 | 50 | 44 |
| Gold wire deformation rate | (%) | 1.1 | 2.8 | 0.6 | 2.0 | 1.5 | 1.3 | 1.0 |
| Soldering resistance | after treatment at 60° C./60% for 168 hr | 0/10 | 0/10 | 0/10 | 0/10 | 0/10 | 0/10 | 0/10 |
| | after treatment at 85° C./60% for 168 hr | 0/10 | 0/10 | 0/10 | 1/10 | 0/10 | 0/10 | 0/10 |

TABLE 13

| | | Experimental Example | | | | | | |
|---|---|---|---|---|---|---|---|---|
| | | a-8 | a-9 | a-10 | a-11 | a-12 | a-13 | a-14 |
| Epoxy resin 1 | | 2.57 | 2.52 | 2.55 | 1.47 | 3.75 | 2.55 | 2.55 |
| Epoxy resin 2 | | 2.56 | 2.51 | 2.56 | 3.42 | 1.60 | 2.56 | 2.56 |
| Epoxy resin 3 | | | | | | | | |
| Phenol resin 1 | | 4.92 | 4.82 | 4.89 | 5.11 | 4.65 | 4.89 | 4.89 |
| Phenol resin 2 | | | | | | | | |
| Phenol resin 3 | | | | | | | | |
| Phenol resin 4 | | | | | | | | |
| Butadiene-acrylonitrile copolymer 1 | | 0.10 | 0.30 | | 0.15 | 0.15 | 0.15 | 0.15 |
| Butadiene-acrylonitrile copolymer 2 | | | | 0.15 | | | | |
| Triphenylphosphine | | 0.15 | 0.15 | 0.15 | 0.15 | 0.15 | 0.15 | |
| DBU | | | | | | | | 0.15 |
| Spherical fused silica | | 89.00 | 89.00 | 89.00 | 89.00 | 89.00 | 89.00 | 89.00 |
| γ-Glycidylpropyltrimethoxysilane | | 0.20 | 0.20 | 0.20 | 0.20 | 0.20 | | 0.20 |
| γ-Mercaptopropylmethoxysilane | | | | | | | 0.20 | |
| Carnauba wax | | 0.20 | 0.20 | 0.20 | 0.20 | 0.20 | 0.20 | 0.20 |
| Carbon black | | 0.30 | 0.30 | 0.30 | 0.30 | 0.30 | 0.30 | 0.30 |
| Spiral flow | (cm) | 130 | 98 | 105 | 150 | 100 | 125 | 105 |
| Package warpage | (μm) | 42 | 50 | 48 | 52 | 38 | 45 | 40 |
| Gold wire deformation rate | (%) | 0.90 | 2.2 | 1.9 | 0.5 | 2.0 | 1.1 | 1.9 |
| Soldering resistance | after treatment at 60° C./60% for 168 hr | 0/10 | 0/10 | 0/10 | 0/10 | 0/10 | 0/10 | 0/10 |
| | after treatment at 85° C./60% for 168 hr | 0/10 | 0/10 | 0/10 | 1/10 | 0/10 | 0/10 | 0/10 |

TABLE 14

| | Experimental Example | | | | | | | |
|---|---|---|---|---|---|---|---|---|
| | a-15 | a-16 | a-17 | a-18 | a-19 | a-20 | a-21 | a-22 |
| Epoxy resin 1 | | 5.76 | 2.59 | 2.41 | 6.13 | 0.77 | 2.75 | 3.34 |
| Epoxy resin 2 | 4.59 | | 2.59 | 2.42 | 6.13 | 0.76 | 2.74 | 3.35 |
| Phenol resin 1 | 5.41 | 4.24 | 4.97 | 4.62 | 11.74 | 1.47 | | |
| Phenol resin 3 | | | | | | | 4.51 | |
| Phenol resin 4 | | | | | | | | 3.31 |
| Butadiene-acrylonitrile copolymer 1 | 0.15 | 0.15 | | 0.70 | 0.15 | 0.15 | 0.15 | 0.15 |
| Triphenylphosphine | 0.15 | 0.15 | 0.15 | 0.15 | 0.15 | 0.15 | 0.15 | 0.15 |
| Spherical fused silica | 89.00 | 89.00 | 89.00 | 89.00 | 75.00 | 96.00 | 89.00 | 89.00 |
| γ-Glycidylpropyltrimethoxysilane | 0.20 | 0.20 | 0.20 | 0.20 | 0.20 | 0.20 | 0.20 | 0.20 |
| Carnauba wax | 0.20 | 0.20 | 0.20 | 0.20 | 0.20 | 0.20 | 0.20 | 0.20 |
| Carbon black | 0.30 | 0.30 | 0.30 | 0.30 | 0.30 | 0.30 | 0.30 | 0.30 |
| Spiral flow (cm) | 165 | 77 | 124 | 85 | 160 | 54 | 125 | 135 |
| Package warpage (μm) | 58 | 37 | 42 | 45 | 85 | 23 | 65 | 54 |
| Gold wire deformation rate (%) | 0.3 | 6.4 | 1.5 | 5.5 | 0.5 | 15.0 | 1.5 | 1.9 |
| Soldering resistance after treatment at 60° C./60% for 168 hr | 5/10 | 0/10 | 6/10 | 0/10 | 10/10 | 5/10 | 3/10 | 8/10 |
| after treatment at 85° C./60% for 168 hr | 10/10 | 0/10 | 10/10 | 0/10 | 10/10 | 8/10 | 6/10 | 10/10 |

It is apparent that the present invention is not limited to the above embodiment, that may be modified and changed without departing from the scope and spirit of the invention.

What is claimed is:

1. An epoxy resin composition for encapsulating a semiconductor chip comprising, (A) a crystalline epoxy resin represented by general formula (4):

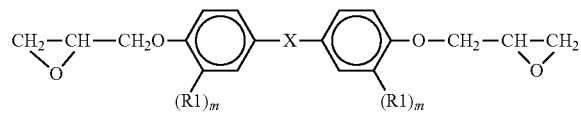

wherein X is group selected from single bond, —O—, —S— and —C(R2)$_2$—; R1 is alkyl having 1 to 6 carbon atoms; two or more R1s are the same or different; m is an integer of 0 to 4; R2 is hydrogen or alkyl having 1 to 4 carbon atoms; and two or more R2s are the same or different, (B) a phenol resin represented by general formula (5):

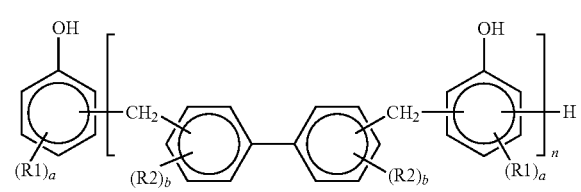

wherein R1 and R2 are independently hydrogen or alkyl having 1 to 4 carbon atoms;

two or more R1s or two or more R2s are the same or different; a is an integer of 0 to 3; b is an integer of 0 to 4; n is an average and is a positive number of 1 to 5, (C-2) from 0.05 wt % to 0.5 wt % of a carboxyl-terminated butadiene-acrylonitrile copolymer both inclusive in the total epoxy resin composition represented by general formula (3)

$$HOOC\text{-}[\text{-}(Bu)_x(CAN)_y\text{-}]_z\text{-}COOH \quad (3)$$

Wherein Bu represents a butadiene-derived structural unit, ACN represents an acrylonitrile-derived structural unit, x is a positive number of less than 1; y is a positive number of less than 1; x+y=1; and z is an integer of from 50 to 62, (D) an inorganic filler in the amount of 80 wt % to 95 wt % both inclusive in the total epoxy resin composition, and (F) an epoxy resin represented by general formula (6):

(6)

[structure of formula (6) with OCH$_2$CHCH$_2$ epoxide groups, biphenyl core, R1 and R2 substituents]

wherein R1 and R2 are independently hydrogen or alkyl having 1 to 4 carbon atoms;

two or more R1s or two or more R2s are the same or different; a is an integer of 0 to 3, b is an integer of 0 to 4; and n is an average and is a positive number of 1 to 5.

2. The epoxy resin composition for encapsulating a semiconductor chip as claimed in claim 1, wherein the weight ratio [(F)/(A)] of the epoxy resin (F) to the crystalline epoxy resin (A) represented by general formula (4)

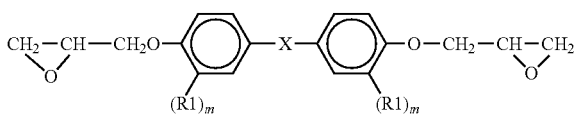

is 10/90 to 90/10 both inclusive.

3. The epoxy resin composition for encapsulating a semiconductor chip as claimed in claim 1, further comprising a curing accelerator (E).

4. A semiconductor device wherein a semiconductor chip is encapsulated with the epoxy resin composition for encapsulating a semiconductor chip as claimed in any one of claims 1, 2 and 3.

5. The epoxy resin composition for encapsulating a semiconductor chip as claimed in any one of 1, 2 and 3 used for encapsulating an area mounting type semiconductor device,
wherein a semiconductor chip is mounted on one side of the substrate and substantially only the side of the substrate mounting the semiconductor chip is encapsulated.

6. An area mounting type semiconductor device, wherein a semiconductor chip is encapsulated with the area mounting type epoxy resin composition for encapsulating a semiconductor chip as claimed in claim 5.

* * * * *